(12) United States Patent
Mishima

(10) Patent No.: US 10,553,650 B2
(45) Date of Patent: Feb. 4, 2020

(54) ORGANIC ELECTROLUMINESCENT ELEMENT, ORGANIC ELECTROLUMINESCENT PANEL, AND LUMINESCENT UNIT COMPRISING A FILM THICKNESS ADJUSTMENT LAYER POSITIONED OUTSIDE OF A RESONATOR

(71) Applicant: JOLED INC., Tokyo (JP)

(72) Inventor: Kosuke Mishima, Tokyo (JP)

(73) Assignee: JOLED INC., Tokyo (JP)

( * ) Notice: Subject to any disclaimer, the term of this patent is extended or adjusted under 35 U.S.C. 154(b) by 204 days.

(21) Appl. No.: 15/885,089

(22) Filed: Jan. 31, 2018

(65) Prior Publication Data

US 2018/0254303 A1 Sep. 6, 2018

(30) Foreign Application Priority Data

Mar. 1, 2017 (JP) ................. 2017-038720

(51) Int. Cl.
| | | |
|---|---|---|
| *H01L 27/32* | (2006.01) | |
| *H01L 51/52* | (2006.01) | |
| *G09G 3/3208* | (2016.01) | |
| *G09G 3/3233* | (2016.01) | |

(52) U.S. Cl.
CPC ........ *H01L 27/3211* (2013.01); *G09G 3/3208* (2013.01); *H01L 27/3246* (2013.01); *H01L 51/5206* (2013.01); *H01L 51/5221* (2013.01); *H01L 51/5262* (2013.01); *H01L 51/5265* (2013.01); *G09G 3/3233* (2013.01); *G09G 2310/0264* (2013.01); *H01L 2251/558* (2013.01)

(58) Field of Classification Search
CPC ................ G09G 3/3208; G09G 3/3233; H01L 27/3211; H01L 27/3246; H01L 51/5206; H01L 51/5221; H01L 51/5265
USPC ...................... 250/205, 214 R, 239
See application file for complete search history.

(56) References Cited

U.S. PATENT DOCUMENTS

| | | | |
|---|---|---|---|
| 8,957,412 B2 * | 2/2015 | Yamada | ............... H01L 51/5265 257/40 |
| 2008/0238295 A1 | 10/2008 | Takei et al. | |
| 2013/0105781 A1 | 5/2013 | Matsushima | |

FOREIGN PATENT DOCUMENTS

| | | |
|---|---|---|
| JP | 2008-243773 A | 10/2008 |
| WO | 2012/025954 A1 | 3/2012 |

* cited by examiner

*Primary Examiner* — Que Tan Le
(74) *Attorney, Agent, or Firm* — Xsensus LLP

(57) ABSTRACT

An organic electroluminescent element includes an organic electroluminescent part and a pair of partition walls. The organic electroluminescent part includes an organic material layer, a resonator, and a film-thickness adjustment layer. The film-thickness adjustment layer has a thickness that is adjusted to allow a difference between a height of a pinning position and a height of a middle position of an upper surface of the organic material layer to fall within a predetermined range. The pinning position is a position at which the upper surface of the organic material layer and each of the partition walls are in contact with each other.

12 Claims, 14 Drawing Sheets

$$\text{FLAT RATE } R = \frac{W2}{W1} \times 100 \quad [\%]$$

ORGANIC ELECTROLUMINESCENT ELEMENT, ORGANIC ELECTROLUMINESCENT PANEL, AND LUMINESCENT UNIT COMPRISING A FILM THICKNESS ADJUSTMENT LAYER POSITIONED OUTSIDE OF A RESONATOR

CROSS REFERENCE TO RELATED APPLICATIONS

This application claims the benefit of Japanese Priority Patent Application JP2017-038720 filed Mar. 1, 2017, the entire contents of which are incorporated herein by reference.

BACKGROUND

The disclosure relates to an organic electroluminescent element, an organic electroluminescent panel, and a luminescent unit.

There is known a method of manufacturing an organic electroluminescent panel by forming an organic electroluminescent element for each pixel with use of an ink jet device. A recent increase in definition has brought a reduction in pixel size and a reduction of a liquid amount to be retained per unit area. From the standpoint of solubility or a printable physical property such as viscosity, however, it is difficult to excessively increase an ink concentration. Note that the bank that defines each pixel is described in, for example, International Publication No. WO 2012/025954 and Japanese Unexamined Patent Application Publication No. 2008-243773, for example.

SUMMARY

In a case where a side of a bank is made lyophilic, however, a meniscus is formed on an ink surface in a process of drying ink. The meniscus is also formed on an upper surface of an ink layer after being dried. This makes a bank vicinity extremely thick in the ink layer, resulting in a phenomenon in which a center part of a pixel emits light strongly. As a result, a part that is usable as a light-emitting part is reduced.

It is desirable to provide an organic electroluminescent element, an organic electroluminescent panel, and a luminescent unit that make it possible to suppress a reduction of a part usable as a light-emitting part.

An organic electroluminescent element according to an embodiment of the disclosure includes: an organic electroluminescent part; and a pair of partition walls provided on both sides of the organic electroluminescent part. The organic electroluminescent part includes an organic material layer including a light-emitting layer that emits electroluminescence light, a resonator that is in contact with the organic material layer, and includes an anode-side reflecting surface and a cathode-side reflecting surface that face each other with the organic material layer provided therebetween, and a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range. The pinning position is a position at which the upper surface of the organic material layer and each of the partition walls are in contact with each other.

An organic electroluminescent panel according to an embodiment of the disclosure includes a plurality of pixels each including a plurality of subpixels. In each of the pixels, at least one of the subpixels includes an organic electroluminescent part, and a pair of partition walls provided on both sides of the organic electroluminescent part. The organic electroluminescent part includes an organic material layer including a light-emitting layer that emits electroluminescence light, a resonator that is in contact with the organic material layer, and includes an anode-side reflecting surface and a cathode-side reflecting surface that face each other with the organic material layer provided therebetween, and a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range. The pinning position is a position at which the upper surface of the organic material layer and each of the partition walls are in contact with each other.

A luminescent unit according to an embodiment of the disclosure includes: an organic electroluminescent panel including a plurality of pixels; and a driver that drives the plurality of pixels. The plurality of pixels each include a plurality of subpixels. In each of the pixels, at least one of the subpixels includes an organic electroluminescent part, and a pair of partition walls provided on both sides of the organic electroluminescent part. The organic electroluminescent part includes an organic material layer including a light-emitting layer that emits electroluminescence light, a resonator that is in contact with the organic material layer, and includes an anode-side reflecting surface and a cathode-side reflecting surface that face each other with the organic material layer provided therebetween, and a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range. The pinning position is a position at which the upper surface of the organic material layer and each of the partition walls are in contact with each other.

DETAILED DESCRIPTION

Figure 1:
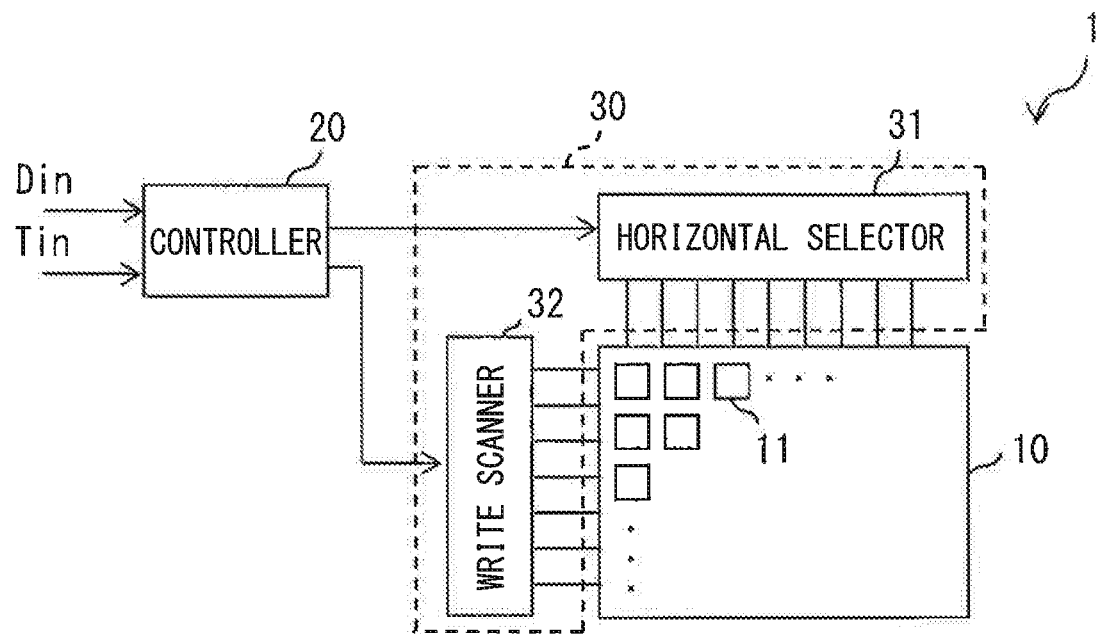
FIG. 1 is a view illustrating a schematic configuration example of an organic electroluminescent unit according to an embodiment of the disclosure.

In the following, some example embodiments of the disclosure are described in detail, in the following order, with reference to the accompanying drawings. Note that the following description is directed to illustrative examples of the disclosure and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail.

Embodiments

Figure 2:
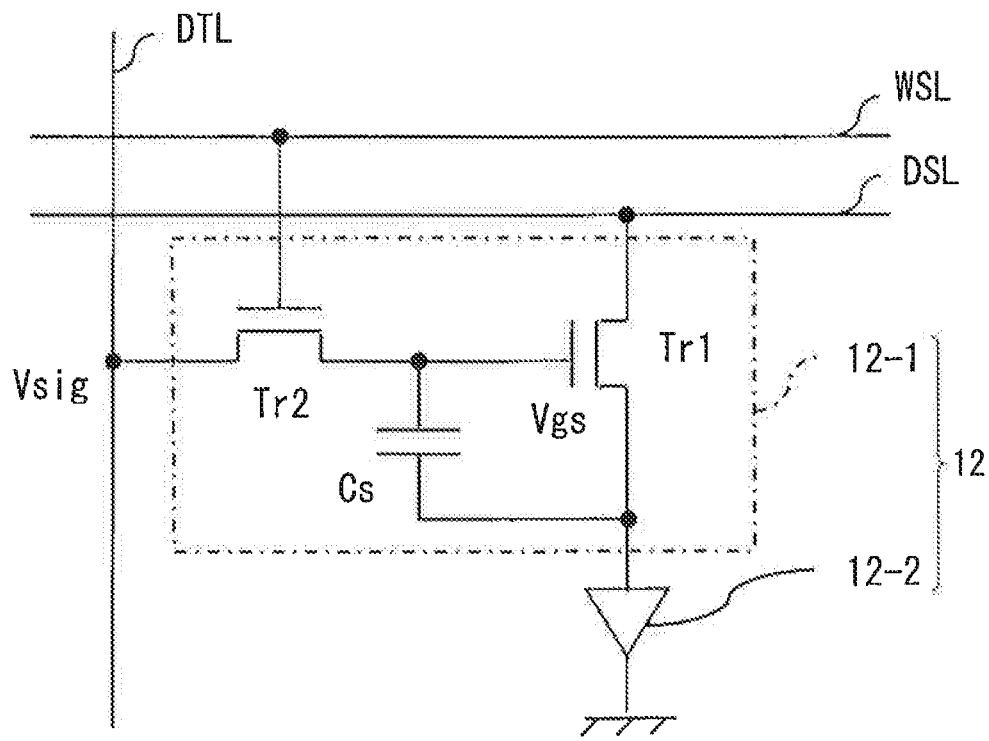
FIG. 2 is a view illustrating a circuit configuration example of subpixels included in each pixel of FIG. 1.

[Configuration]
FIG. 1 illustrates a schematic configuration example of an organic electroluminescent unit 1 according to an embodiment of the disclosure. FIG. 2 illustrates an example of a circuit configuration of a subpixel 12 included in each pixel 11 that is provided in the organic electroluminescent unit 1. The organic electroluminescent unit 1 may include an organic electroluminescent panel 10, a controller 20, and a driver 30, for example. The driver 30 may be implemented on an outer edge of the organic electroluminescent panel 10. The organic electroluminescent panel 10 may have a plurality of pixels 11 disposed in matrix. The controller 20 and the driver 30 may drive the organic electroluminescent panel 10, i.e., drive the plurality of pixels 11, on the basis of an image signal Din and a synchronization signal Tin. The image signal Din and the synchronization signal Tin may be inputted from outside.

(Organic Electroluminescent Panel 10)
Each of the pixels 11 may be active-matrix-driven by the controller 20 and the driver 30. Thereby, the organic electroluminescent panel 10 may display an image based on the image signal Din and the synchronization signal Tin that are inputted from the outside. The organic electroluminescent panel 10 may have a plurality of scan lines WSLs extending in a row direction, a plurality of signal lines DTLs and a plurality of power lines DSLs both extending in a column direction, and the plurality of pixels 11 that are disposed in matrix.

The scan lines WSLs may be used to select the respective pixels 11. The scan lines WSL may supply the respective pixels 11 with a selection pulse that selects the pixels 11 on a predetermined unit basis, such as a pixel row basis, for example. The signal lines DTLs may be used to supply a signal voltage Vsig to the respective pixels 11. The signal voltage Vsig may be based on the image signal Din. The signal lines DTLs may supply a data pulse including the signal voltage Vsig to the respective pixels 11. The power lines DSLs may supply electric power to the respective pixels 11.

Each of the pixels 11 may include a subpixel 12 that emits red light, a subpixel 12 that emits green light, and a subpixel 12 that emits blue light, for example. Furthermore, each of the pixels 11 may also include a subpixel 12 that emits light of any other color, which may be white or yellow, for example. In each of the pixels 11, the subpixels 12 may be arranged in a line in a predetermined direction, for example.

Each of the signal lines DTLs may be coupled to an output end of a horizontal selector 31 to be described later. The signal lines DTLs, for example, may be each assigned to corresponding one of pixel columns. Each of the scan lines WSLs may be coupled to an output end of a write scanner 32 to be described later. The scan lines WSLs, for example, may be each assigned to corresponding one of pixel rows. Each of the power lines DSLs may be coupled to an output end of a power supply. The power lines DSLs, for example, may be each assigned to corresponding one of the pixel rows.

Each of the subpixels 12 may have a pixel circuit 12-1 and an organic electroluminescent element 12-2. The organic electroluminescent element 12-2 may correspond to a specific example of an "organic electroluminescent unit" in one embodiment of the disclosure. A configuration of the organic electroluminescent element 12-2 is described later in detail.

The pixel circuit 12-1 may control light emission and light extinction of the organic electroluminescent element 12-2. The pixel circuit 12-1 may hold a voltage written into corresponding one of the subpixels 12 through write scan. The write scan is described later. The pixel circuit 12-1 may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may correspond to the image signal Din. For example, the switching transistor Tr2 may perform sampling of a voltage of the signal line DTL and write the voltage obtained through the sampling to the gate of the driving transistor Tr1. The driving transistor Tr1 may be coupled in series to the organic electroluminescent element 12-2. The driving transistor Tr1 may drive the organic electroluminescent element 12-2. The driving transistor Tr1 may control an electric current flowing through the organic electroluminescent element 12-2 in accordance with a magnitude of the voltage sampled by the switching transistor Tr2. The storage capacitor Cs may store a predetermined voltage between a gate and a source of the driving transistor Tr1. The storage capacitor Cs may keep a gate-source voltage Vgs of the driving transistor Tr1 constant for a predetermined period of time. Note that the pixel circuit 12-1 may have a circuit configuration in which various capacitors or transistors are added to a circuit of 2Tr1C described above. Alternatively, the pixel circuit 12-1 may have a different circuit configuration from the circuit configuration of the 2Tr1C described above.

Each of the signal lines DTLs may be coupled to an output end of the horizontal selector 31 and to a source or a drain of the switching transistor Tr2. The horizontal selector 31 is described later. Each of the scan lines WSLs may be coupled to the output end of the write scanner 32 and to a gate of the switching transistor Tr2. The write scanner 32 is described below. Each of the power lines DSLs may be coupled to a power circuit and the source or a drain of the driving transistor Tr1.

The gate of the switching transistor Tr2 may be coupled to the scan line WSL. The source or the drain of the switching transistor Tr2 may be coupled to the signal line DTL. Of the source and the drain of the switching transistor Tr2, a terminal not coupled to the signal line DTL may be coupled to the gate of the driving transistor Tr1. The source or the drain of the driving transistor Tr1 may be coupled to the power line DSL. Of the source and the drain of the driving transistor Tr1, a terminal not coupled to the power line DSL may be coupled to an anode 21 of the organic electroluminescent element 12-2. One end of the storage capacitor Cs may be coupled to the gate of the driving transistor Tr1. Other end of the storage capacitor Cs may be coupled to a terminal on the side of the organic electroluminescent element 12-2 of the source and the drain of the driving transistor Tr1.

(Driver 30)

The driver 30 may have the horizontal selector 31 and the write scanner 32, for example. In response to, or in synchronization with, input of a control signal, for example, the horizontal selector 31 may apply the analog signal voltage Vsig to each of the signal lines DTLs. The analog signal voltage Vsig may be inputted from the controller 20. The write scanner 32 may scan the plurality of subpixels 12 on a predetermined unit basis.

(Controller 20)

The controller 20 is described in the following. The controller 20 may perform a predetermined correction on the digital image signal Din and generate the signal voltage Vsig on the basis of the thus-obtained image signal. The image signal Din may be inputted from the outside, for example. The controller 20 may output the generated signal voltage Vsig to the horizontal selector 31, for example. In response to, or in synchronization with, the synchronization signal Tin, the controller 20 may output a control signal to each circuit in the driver 30. The synchronization signal may be inputted from the outside, for example.

Figure 3:
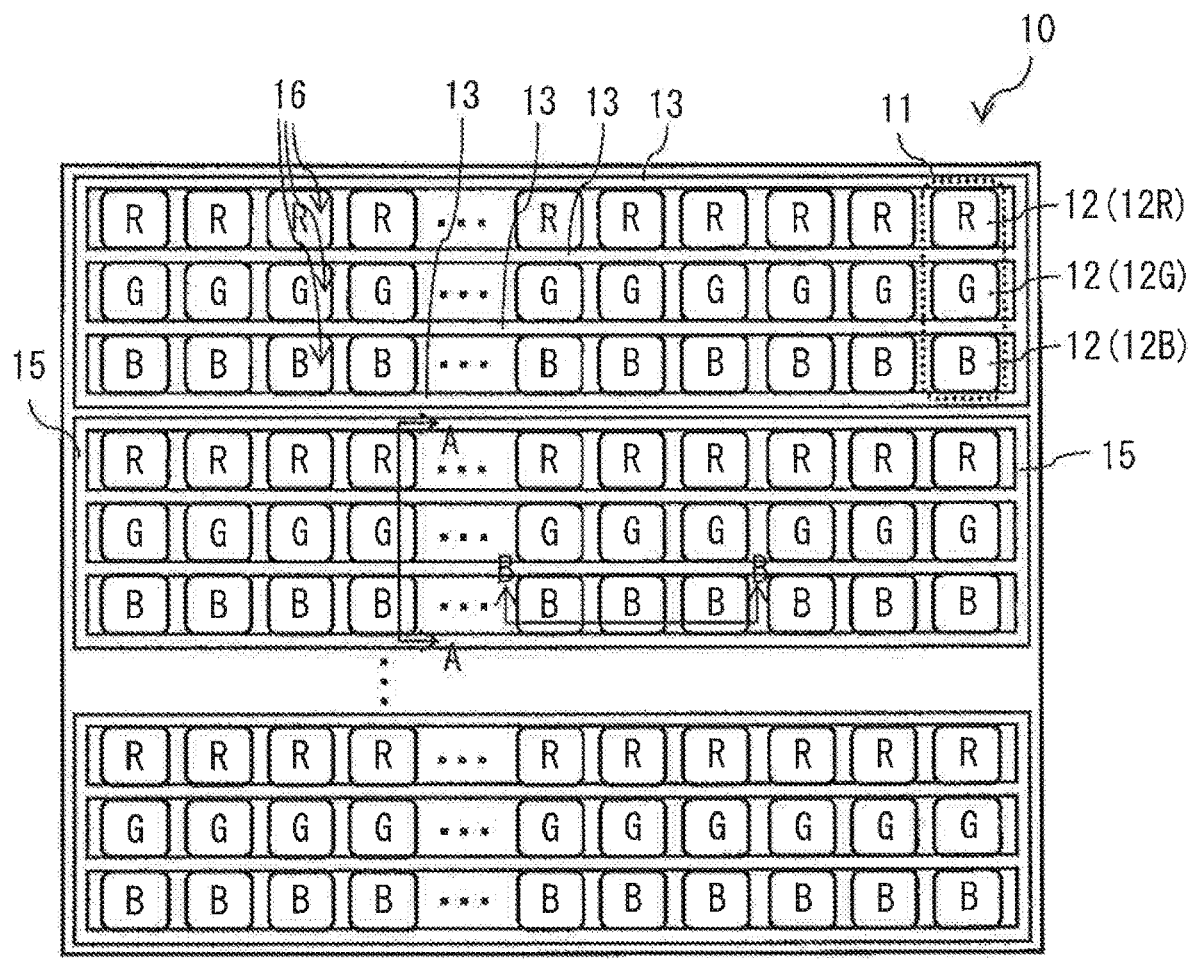
FIG. 3 is a view illustrating a schematic configuration example of an organic electroluminescent panel of FIG. 1.
Figure 4:
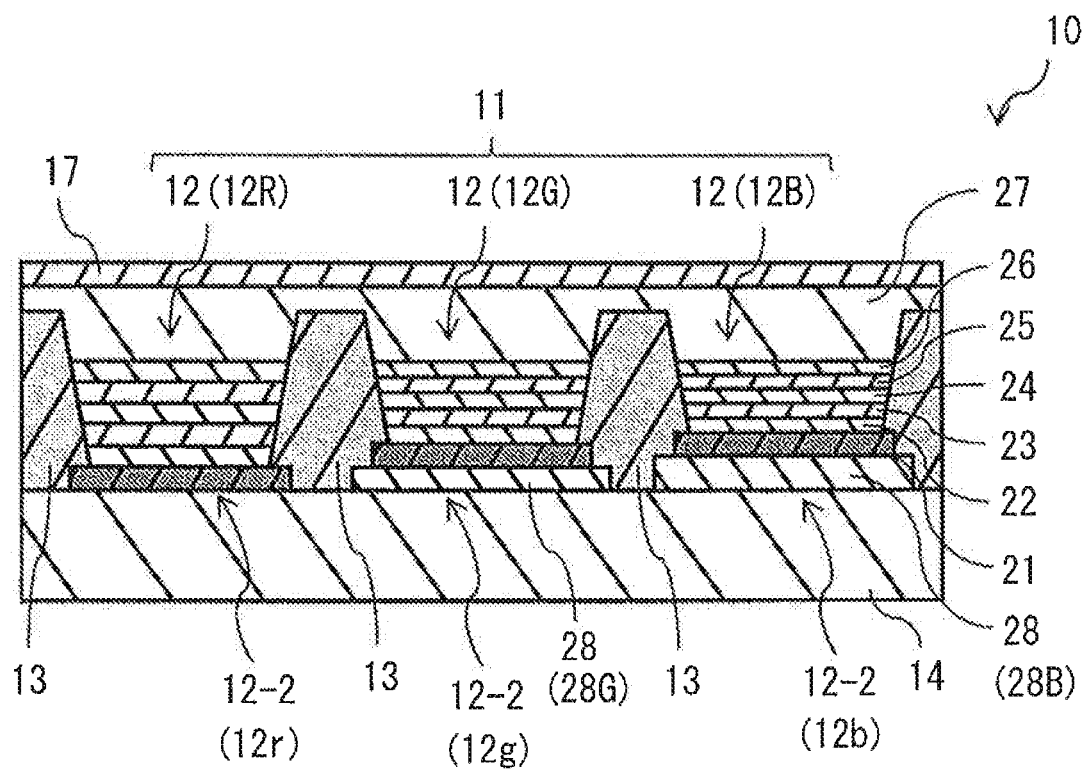
FIG. 4 is a view illustrating a cross-sectional configuration example, taken along a line A-A, of the organic electroluminescent panel of FIG. 3.
Figure 5:
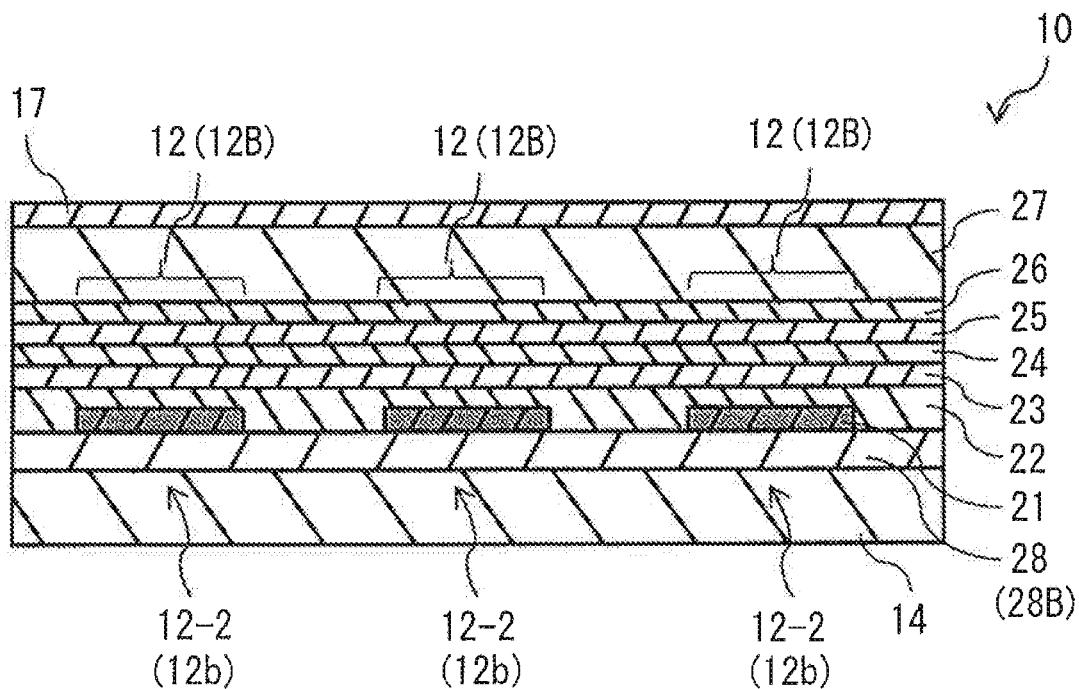
FIG. 5 is a view illustrating a cross-sectional configuration example, taken along a line B-B, of the organic electroluminescent panel of FIG. 3.
Figure 6:
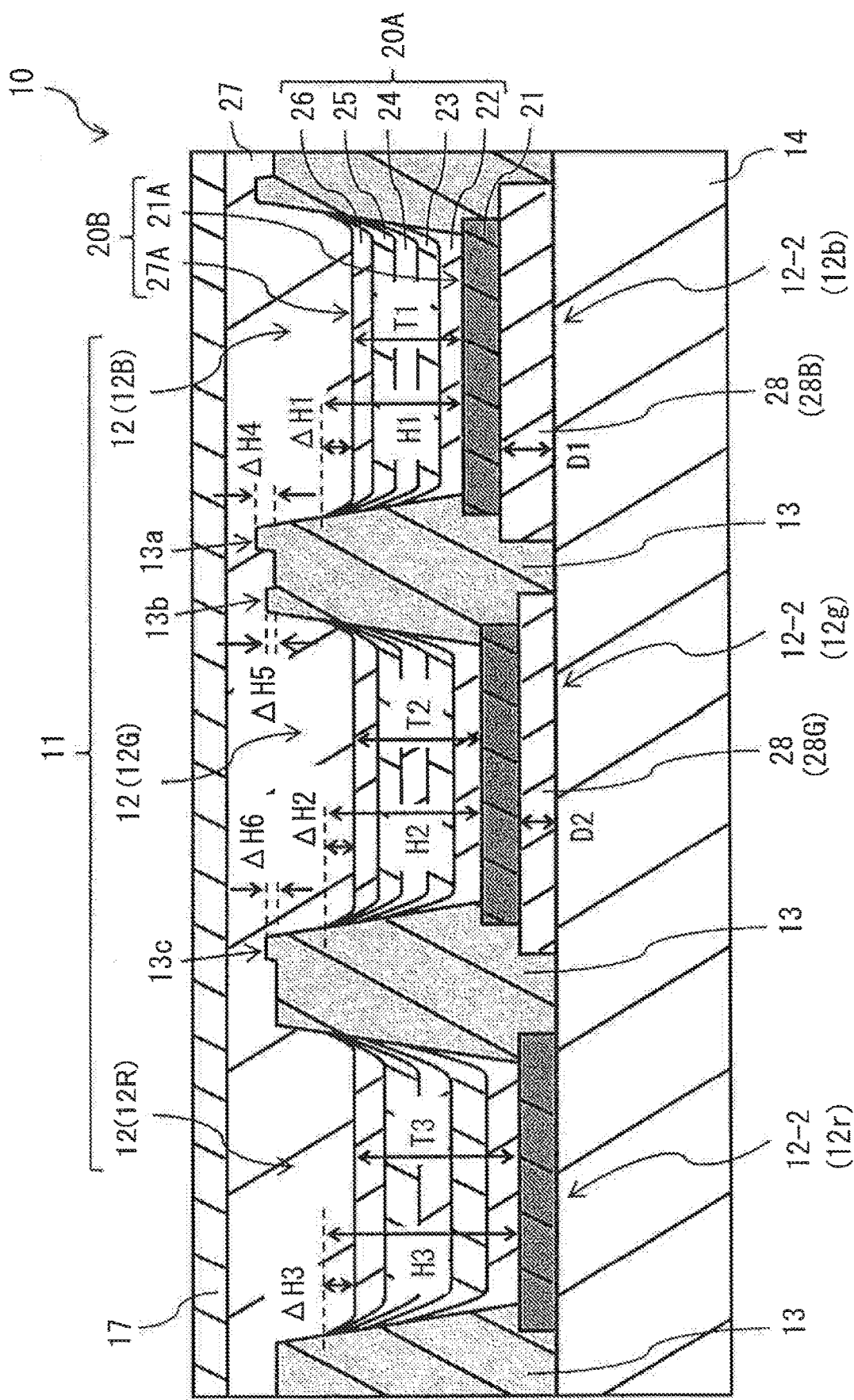
FIG. 6 is an enlarged view of a cross-sectional configuration example of the organic electroluminescent panel of FIG. 4.

The organic electroluminescent element 12-2 is described hereinafter with reference to FIG. 3, FIG. 4, FIG. 5, and FIG. 6. FIG. 3 illustrates a schematic configuration example of the organic electroluminescent panel 10. FIG. 4 illustrates a cross-sectional configuration example of the organic electroluminescent panel 10 taken along a line A-A of FIG. 3. FIG. 5 illustrates a cross-sectional configuration example of the organic electroluminescent panel 10 taken along a line B-B of FIG. 3. FIG. 6 is an enlarged view illustrating a cross-sectional configuration example of the organic electroluminescent element 12-2 of FIG. 4.

The organic electroluminescent panel 10 may have the plurality of pixels 11 arranged in matrix. As described above, each of the pixels 11 may include the subpixel 12 (12R) that emits red light, the subpixel 12 (12G) that emits green light, and the subpixel 12 (12B) that emits blue light, for example. The subpixel 12R may include the organic electroluminescent element 12-2 (12r) that emits red light. The subpixel 12G may include the organic electroluminescent element 12-2 (12g) that emits green light. The subpixel 12B may include the organic electroluminescent element 12-2 (12b) that emits blue light. The subpixels 12R, 12G, and 12B may be arranged in stripes, for example. For example, in each of the pixels 11, the subpixels 12R, 12G, and 12B may be disposed in the column direction. Furthermore, in each pixel row, the plurality of subpixels 12 that emit pieces of light of the same color may be disposed in the row direction, for example.

The organic electroluminescent panel 10 may have, on a substrate 14, a plurality of line banks 13 extending in the row direction. The line banks 13 may correspond to a specific example of "partition walls" in one embodiment of the disclosure. The plurality of line banks 13 may define the subpixels 12 in each of the pixels 11. The organic electroluminescent panel 10 may further have a plurality of banks 15 on the substrate 14. The plurality of banks 15 may have ends of the plurality of line banks 13 attached to each other. Each of the banks 15 may extend in the column direction. The substrate 14 may include a base member and a wiring layer. The base member may support, without limitation, each of the organic electroluminescent elements 12-2 and each of the line banks 13, for example. The wiring layer may be provided on the base member. The base member in the substrate 14 may include, without limitation, a glass substrate or a flexible substrate, for example. Non-limiting examples of a material of the glass substrate used as the base member in the substrate 14 may include alkali-free glass, soda glass, non-fluorescent glass, phosphate glass, boric acid glass, or quartz, for example. Non-limiting examples of a material of the flexible substrate used as the base member in the substrate 14 may include acrylic-based resin, styrene-based resin, polycarbonate-based resin, epoxy-based resin, polyethylene, polyester, or silicone-based resin, for example. The wiring layer in the substrate 14 may include the pixel circuit 12-1 of each of the pixels 11, for example.

The line banks 13 and the banks 15 may include an insulating organic material, for example. The insulating organic material may include but not limited to acrylic-based resin, polyimide-based resin, or novolac-based phenolic resin. The line banks 13 and the banks 15 may include, for example, insulating resin that is heat-resistant and resistant to a solvent. The line banks 13 and the banks 15 may be formed by processing, for example, insulating resin into a predetermined pattern through photolithography and development. A cross-sectional shape of the line bank 13 may be of a forward taper type as illustrated in FIG. 4 or of a backward taper type in which a hem is narrow.

A region surrounded by two of the line banks 13 that are mutually parallel and adjacent to each other and by the banks 15 at both ends may be a groove 16. In each of the subpixels 12, one of the organic electroluminescent elements 12-2 may be disposed in a gap of the two line banks 13 that are mutually parallel and adjacent to each other. For example, in each of the subpixels 12, one of the organic electroluminescent elements 12-2 may be disposed in the groove 16. Each of the organic electroluminescent elements 12-2 may have, for example, the anode 21, a hole-injection layer 22, a hole-transport layer 23, an organic light-emitting layer 24, an electron-transport layer 25, an electron-injection layer 26, and a cathode 27 in this order from a side of the substrate 14. A laminate 20A that includes the hole-injection layer 22, the hole-transport layer 23, the organic light-emitting layer 24, the electron-transport layer 25, and the electron-injection layer 26 may correspond to a specific example of an "organic material layer" in one embodiment of the disclosure. The organic light-emitting layer 24 may correspond to a specific example of a "light-emitting layer" in one embodiment of the disclosure. The anode 21 may correspond to a specific example of an "anode electrode" in one embodiment of the disclosure.

Each of the organic electroluminescent elements 12-2 may have the laminate 20A that includes the organic light-emitting layer 24. The organic light-emitting layer 24 may emit electroluminescence light. Furthermore, each of the organic electroluminescent elements 12-2 may have a resonator 20B. The resonator 20B may be in contact with the laminate 20A and include a reflecting surface 21A and a reflecting surface 27A, for example. The reflecting surfaces 21A and 27A may be disposed to face each other with the laminate 20A provided therebetween. In one embodiment, the reflecting surface 21A may be an upper surface of the anode 21 and a surface of the anode 21 that is in contact with the laminate 20A. The reflecting surface 27A may be a lower surface of the cathode 27 and a surface of the cathode 27 that is in contact with the laminate 20A. The resonator 20B is provided to obtain a sharp emission spectrum, making use of a resonance phenomenon of light. The resonator 20B may repeatedly reflect electroluminescence light emitted from the organic light-emitting layer 24 and generate a standing wave. The standing wave may be stable only in a certain wavelength. The standing wave may be generated when an optical path length of the resonator 20B is an integral multiple of a half-wavelength.

The hole-injection layer 22 may improve hole injection efficiency. The hole-transport layer 23 may transport, to the organic light-emitting layer 24, holes injected from the anode 21. The organic light-emitting layer 24 may emit electroluminescence light of a predetermined color through a recombination of electrons and holes. The electron-transport layer 25 may transport, to the organic light-emitting layer 24, electrons injected from the cathode 27. The electron-injection layer 26 may improve electron injection efficiency. The hole-injection layer 22, the electron-injection layer 26, or both may be omitted. Each of the organic electroluminescent elements 12-2 may further have any layer other than those mentioned above.

The anode 21 may be disposed on the substrate 14, for example. Furthermore, the anode 21 may be so disposed that edges of the anode 21 are embedded in the line banks 13, for example. Thus, at least a part of the edges of the anode 21 may be located immediately below each of the line banks 13. In one subpixel row, the anodes 21 may be equally spaced in a direction in which the groove 16 extends, for example. The anode 21 may be a reflecting electrode that has reflectivity, for example. The anode 21 may be a reflecting conducting film that includes an electrically-conducting material such as but not limited to aluminum (Al), silver (Ag), or an alloy of aluminum or silver. For example, in this case, the reflecting surface 21A of the anode 21 may be an anode reflecting surface. Alternatively, the anode 21 may have a configuration in which a reflecting electrode is stacked on a transparent electrode, for example. Furthermore, the anode 21 may be a reflecting electrode that has translucency. In this case, the anode 21 may include a transparent conducting film and an Al thin film. The transparent conducting film may include a transparent conducting material such as but not limited to Indium Tin Oxide (ITO) or Indium Zinc Oxide (IZO). The Al thin film may be disposed on a surface of the transparent conducting film. In such an example, the reflecting surface 21A of the anode 21 may be an anode semi-transmissive surface.

In a case where the anode 21 is the reflecting electrode that has reflectivity, the cathode 27 may be a reflecting electrode that is semi-transmissive. In such an example, the cathode 27 may include a transparent conducting film and an Al thin film. The transparent conducting film may include a transparent conducting material such as but not limited to ITO or IZO. The Al thin film may be disposed on a surface of the transparent conducting film. In such an example, the reflecting surface 27A of the cathode 27 may be a cathode semi-transmissive surface. In a case where the anode 21 is a reflecting electrode that has translucency, the cathode 27 may be a reflecting electrode that has reflectivity. In such an example, the cathode 27 may include but not limited to aluminum (Al), magnesium (Mg), silver (Ag), an aluminum-lithium alloy, or a magnesium-silver alloy, for example. In such an example, the reflecting surface 27A of the cathode 27 may be a cathode reflecting surface. In a case where the substrate 14 and the anode 21 have translucency and the cathode 27 has reflectivity, the organic electroluminescent element 12-2 may have a bottom emission structure in which the organic electroluminescent element 12-2 emits light from the side of the substrate 14. In a case where the anode 21 has reflectivity and the cathode 27 has translucency, the organic electroluminescent element 12-2 may have a top emission structure in which the organic electroluminescent element 12-2 emits light from a side of the cathode 27.

The hole-injection layer 22 may facilitate injection of holes from the anode 21 to the organic light-emitting layer 24. The hole-injection layer 22 may include an oxide of, for example but not limited to, silver (Ag), molybdenum (Mo), chromium (Cr), vanadium (V), tungsten (W), nickel (Ni), or iridium (Ir), or a conductive polymer material such as PEDOT. PEDOT is a mixture of polythiophene and polystyrene sulfonate.

The hole-transport layer 23 may transport, to the organic light-emitting layer 24, the holes injected from the anode 21. The hole-transport layer 23 may be a coated film, for example. The hole-transport layer 23 may be provided by application and drying of a solution a solute of which has an organic material, for example, as a main component. The organic material may have hole transportability and may be hereinafter referred to as a "hole transportability material 23M". The hole-transport layer 23 may include the hole transportability material 23M as a main component.

The hole transportability material 23M may be a basic ingredient, namely a material, of the hole-transport layer 23. The hole transportability material 23M may be for example but not limited to arylamine derivatives, triazole derivatives, oxadiazole derivatives, imidazole derivatives, polyarylalkane derivatives, pyrazoline derivatives and pyrazolne derivatives, phenylenediamine derivatives, amino-substituted chalcone derivatives, oxazole derivatives, styryl anthracene derivatives, fluorenone derivatives, hydrazone derivatives, stilbene derivatives, butadiene compounds, polystyrene derivatives, triphenylmethane derivatives, and tetraphenyl benzene derivatives, or a material including a combination thereof. The hole transportability material 23M may further have, in its molecular architecture, a soluble group and an insoluble group for solubility and insolubilization features, for example. The insoluble group may be, without limitation, a thermal dissociation soluble group, a crosslinking group, or a desorption protecting group.

The organic light-emitting layer 24 may emit light of a predetermined color through the recombination of holes and electrons. The organic light-emitting layer 24 may be a coating layer. The organic light-emitting layer 24 may be provided by application and drying of a solution a solute of which has an organic material as a main component. The organic material may generate an exciter from the recombination of holes and electrons and emit light. The organic material may be hereinafter referred to as an "organic light-emitting material 24M". The organic light-emitting layer 24 may include the organic light-emitting material 24M as a main component. In the organic electroluminescent element 12r included in the subpixel 12R, the organic light-emitting material 24M may include an organic red light-emitting material. In the organic electroluminescent element 12g included in the subpixel 12G, the organic light-emitting material 24M may include an organic green light-emitting material. In the organic electroluminescent element 12b included in the subpixel 12B, the organic light-emitting material 24M may include an organic blue light-emitting material.

The organic light-emitting layer 24 may include a single-layered organic light-emitting layer or a plurality of organic light-emitting layers that are laminated, for example. In a case where the organic light-emitting layer 24 is the plurality of organic light-emitting layers in which the organic light-emitting layers 24 are laminated, the organic light-emitting layer 24 may be a laminate of the plurality of organic light-emitting layers main components of which are common to each other, for example. In such an example, each of the organic light-emitting layers may be a coating layer. Each of the organic light-emitting layers may be provided by application and drying of a solution a solute of which has the organic light-emitting material 24M as a main component.

The organic light-emitting material 24M may be a basic ingredient, namely a material, of the organic light-emitting layer 24. While the organic light-emitting material 24M may be for example a single dopant material, the organic light-emitting material 24M may include a combination of a host material and a dopant material in one example. In other words, the organic light-emitting layer 24 may include the host material and the dopant material as the organic light-emitting material 24M. The host material may mainly serve to transport charges of electrons or holes, while the dopant material may serve to emit light. The host material and the dopant material may not be limited to only one kind, but may be a combination of two or more kinds. An amount of the dopant material may be equal to or greater than 0.01 weight percent and equal to or smaller than 30 weight percent with respect to the host material. In one example, the amount of the dopant material may be equal to or greater than 0.01 weight percent and equal to or smaller than 10 weight percent.

For example, amine compounds, condensed polyaromatic compounds, or hetero ring compounds may be used as the host material of the organic light-emitting layer 24. For example, monoamine derivatives, diamine derivatives, triamine derivatives, or tetraamine derivatives, without limitation, may be used as the amine compounds. For example, the condensed polyaromatic compounds may include but not limited to anthracene derivatives, naphthalene derivatives, naphthacene derivatives, phenanthrene derivatives, chrysene derivatives, fluoranthene derivatives, triphenylene derivatives, pentacene derivatives, or perylene derivatives. For example, the hetero ring compounds may include but not limited to carbazole derivatives, furan derivatives, pyridine derivatives, pyrimidine derivatives, triazine derivatives, imidazole derivatives, pyrazole derivatives, triazole derivatives, oxazole derivatives, oxadiazole derivatives, pyrrole derivatives, indole derivatives, azaindole derivatives, azacarbazole derivatives, pyrazoline derivatives, pyrazolone derivatives, or phthalocyanine derivatives.

In addition, for example, pyrene derivatives, fluoranthene derivatives, arylacetylene derivatives, fluorene derivatives, perylene derivatives, oxadiazole derivatives, anthracene derivatives, or chrysene derivatives may also be used as the dopant material for the organic light-emitting layer 24. A metal complex may also be used as the dopant material for the organic light-emitting layer 24. The metal complex may include a metal complex having a ligand and a metallic atom such as but not limited to iridium (Ir), platinum (Pt), osmium (Os), gold (Au), rhenium (Re), or ruthenium (Ru).

The electron-transport layer 25 may transport, to the organic light-emitting layer 24, electrons injected from the cathode 27. The electron-transport layer 25 may be a coated film, for example. The electron-transport layer 25 may include an organic material having electron transportability as a main component. The organic material may be hereinafter referred to as an "electron transportability material 25M".

The electron-transport layer 25 may be provided between the organic light-emitting layer 24 and the cathode 27, and may transport, to the organic light-emitting layer 24, electrons injected from the cathode 27. The electron transportability material 25M may be a basic ingredient, namely a material, of the electron-transport layer 25. The electron transportability material 25M may be aromatic hetero ring compounds, for example, that has one or more heteroatoms in a molecule. The aromatic hetero ring compounds may include a compound having a skeleton that includes but not limited to a pyridine ring, a pyrimidine ring, a triazine ring, a benzimidazole ring, a phenanthroline ring, or a quinazoline ring, for example. The electron-transport layer 25 may also include metal having the electron transportability. Inclusion of the metal having the electron transportability enables improved electron transportability of the electron-transport layer 25. For example, barium (Ba), lithium (Li), calcium (Ca), potassium (K), cesium (Cs), sodium (Na), rubidium (Rb), or ytterbium (Yb), without limitation, may be used as metal included in the electron-transport layer 25.

The organic electroluminescent panel 10 may further have a sealing layer 17 that seals each of the organic electroluminescent elements 12-2, for example. The sealing layer 17 may be provided in contact with an upper surface of the cathode 27 of each of the organic electroluminescent elements 12-2.

In the following, the film-thickness adjustment layer 28 is described.

In each of the pixels 11, the organic electroluminescent element 12-2 included in at least one of the plurality of subpixels 12 may have the film-thickness adjustment layer 28. FIG. 4 exemplarily illustrates one embodiment in which the film-thickness adjustment layer 28 is provided for the organic electroluminescent element 12-2 (12g) and the organic electroluminescent element 12-2 (12b). In FIG. 4, the film-thickness adjustment layer 28G may be provided for the organic electroluminescent element 12-2 (12g), and the film-thickness adjustment layer 28B may be provided for the organic electroluminescent element 12-2 (12b). In the following description, one embodiment is described in which the film-thickness adjustment layer 28 is provided only for the organic electroluminescent element 12-2 (12g) and the organic electroluminescent element 12-2 (12b).

The film-thickness adjustment layer 28 may be provided at a position that is outside of the resonator 20B and closer to the reflecting surface 21A. Thus, the film-thickness adjustment layer 28 may not lie in the resonator 20B and may not be intended for optical adjustment of the resonator 20B. The film-thickness adjustment layer 28 may be located immediately below the anode 21. For example, the film-thickness adjustment layer 28 may be disposed between the substrate 14 and the anode 21. The film-thickness adjustment layer 28 may adjust a distance of the reflecting surface 21A of the anode 21 from the substrate 14. For example, the film-thickness adjustment layer 28B may have a thickness that is adjusted to allow a difference $\Delta H$ between a height H of a pinning position and a height T at a middle position of an upper surface of the laminate 20A to fall within a predetermined range. The difference $\Delta H$ may be $\Delta H1$. The height H may be H1. The height T may be T1. The laminate 20A may be the electron-injection layer 26, for example. The pinning position is where the upper surface of the laminate 20A, which may be the electron-injection layer 26, for example, and the line bank 13 may be in contact with each other. The film-thickness adjustment layer 28G may have a thickness that is adjusted to allow a difference $\Delta H$ between a height H of a pinning position and a height T at the middle position of the upper surface of the laminate 20A to fall within a predetermined range. The difference $\Delta H$ may be $\Delta H2$. The height H may be H2. The height T may be T2. The laminate 20A may be the electron-injection layer 26, for example. The pinning position is where the upper surface of the laminate 20A, which may be the electron-injection layer 26, for example, and the line bank 13 may be in contact with each other. A thickness of the anode 21 in the organic electroluminescent element 12-2 (12r) may be adjusted to allow a difference $\Delta H$ between a height H at a pinning position on the subpixel 12R and a height T at the middle position of the upper surface of the laminate 20A to fall within a predetermined range. The difference $\Delta H$ may be $\Delta H3$. The height H may be H3. The height T may be T3. The laminate 20A may be the electron-injection layer 26, for example. Furthermore, the pinning position may correspond to a boundary position between a lyophilic region and a liquid-repellent region on a side face of the line bank 13.

Figure 7:
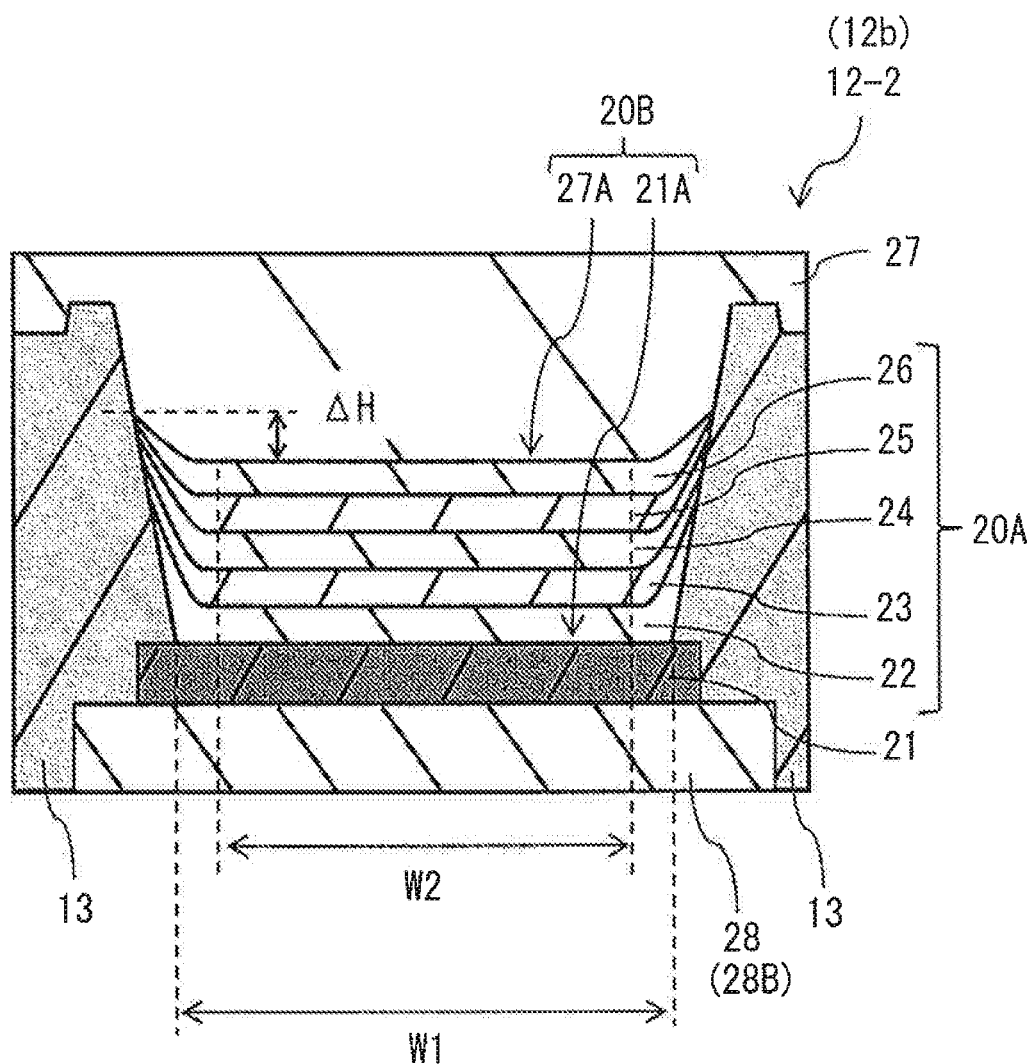
FIG. 7 is an enlarged view of a cross-sectional configuration example of an organic electroluminescent element of FIG. 4.

An upper limit of the difference $\Delta H$ ($\Delta H1$, $\Delta H2$, and $\Delta H3$) may depend on a flatness rate R. The flatness rate R may be expressed by an expression (1) illustrated in FIG. 7 or below.

Flatness rate $R = W2/W1 \times 100 [\%]$     Expression (1)

Here, W1 may represent a width of a location exposed in the groove 16 on the upper surface of the anode 21. W2 may represent a width of a flat region on the upper surface of the laminate 20A. The laminate 20A may be the electron-injection layer 26, for example. The "flat region" may refer to a region that falls within ±10% from a reference height. The reference height is based on a height of the middle position on the upper surface of the anode 21. From the standpoint of suppressing a reduction of the emission area, the flatness rate R may be equal to or higher than 50%.

Figure 8:
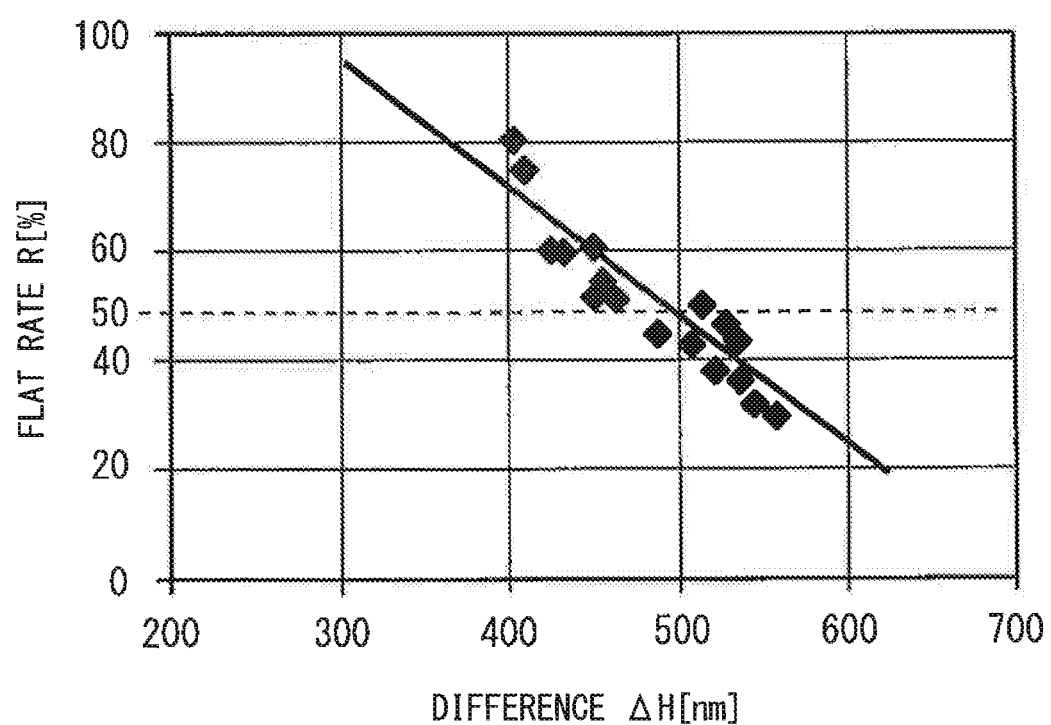
FIG. 8 is a view illustrating a relationship between a difference and a rate of planarization.

FIG. 8 illustrates results of measurements of a relationship between the difference $\Delta H$ and the flatness rate R. It is seen from FIG. 8 that when the flatness rate R is equal to or higher than 50%, the difference $\Delta H$ ($\Delta H1$, $\Delta H2$, and $\Delta H3$) may be equal to or smaller than 500 nm. Note that a lower limit of the difference $\Delta H$ ($\Delta H1$, $\Delta H2$, and $\Delta H3$) may depend on constraints in a manufacturing process. For example, a depth of a meniscus, formed as a result of dropping, into the groove 16, ink at a maximum amount that allows for the dropping without spilling the ink from the groove 16 and drying the ink thereafter in the manufacturing process, may correspond to a lower limit of the difference $\Delta H$ ($\Delta H1$, $\Delta H2$, and $\Delta H3$). The depth of the meniscus may be approximately 300 nm, for example. In a process of manufacturing each of the organic electroluminescent elements 12-2, a meniscus may be formed on an ink liquid surface. A meniscus may also be formed on an upper surface of an ink layer after being dried. For this reason, in each of the organic electroluminescent elements 12-2, a meniscus may be present to a greater or lesser extent on an upper surface of the hole-injection layer 22, an upper surface of the hole-transport layer 23, an upper surface of the organic light-emitting layer 24, an upper surface of the electron-transport layer 25, and an upper surface of the electron-injection layer 26.

FIG. 6 illustrates one embodiment in which a thickness D1 of the film-thickness adjustment layer 28B is thicker than a thickness D2 of the film-thickness adjustment layer 28G. The thickness D1 may be equal to t2 and the thickness D2 may be equal to t1. A thickness T1 of the laminate 20A of the subpixel 12B may be thinner than a thickness T2 of the laminate 20A of the subpixel 12G, and the thickness T2 of the laminate 20A of the subpixel 12G is thinner than a thickness T3 of the laminate 20A of the subpixel 12R. The thickness T1 may be equal to t4 and the thickness T2 may be equal to t3. In addition, the optical path length of the resonator 20B may determine the thickness, D1 and D2. Hence, the thickness D1 may not be typically thicker than the thickness D2. There may be some cases in which the thickness D2 is thicker than the thickness D1. In this case, however, the thickness T2 may be thinner than the thickness T1.

The film-thickness adjustment layer 28 may be disposed on a same surface as a surface where the line bank 13 is disposed. The film-thickness adjustment layer 28 may be so disposed as to be in contact with the upper surface of the substrate 14. Furthermore, the film-thickness adjustment layer 28 may be disposed so that the edges of the film-thickness adjustment layer 28 are embedded in the line banks 13. Therefore, at least a part of the edge of the film-thickness adjustment layer 28 may be located immediately below each of the line banks 13. The film-thickness adjustment layer 28 may be disposed on an entire bottom face of the groove 16, for example. The film-thickness adjustment layer 28 may be in a shape of a strip extending in a direction in which the groove 16 extends, for example. The film-thickness adjustment layer 28 may include an insulating layer of an insulating material such as but not limited to SiO, SiN, or SiON.

In the following, a shape of an upper part of the line bank 13 is described.

Suppose that the edges of the film-thickness adjustment layer 28 and the anode 21 are embedded in the line banks 13. In such a case, the upper part of the line bank 13 may have a step that follows the edges of the film-thickness adjustment layer 28 and the anode 21. For example, on an upper part of the line bank 13 provided between the organic electroluminescent element 12b and the organic electroluminescent element 12g, a step 13a may be disposed at a position closer to the organic electroluminescent element 12b. The step 13a may follow the edge of the film-thickness adjustment layer 28B. FIG. 6 illustrates ΔH4 as a height of this step 13a. In addition, on the upper part of the line bank 13 provided between the organic electroluminescent element 12b and the organic electroluminescent element 12g, for example, a step 13b may be disposed at a position closer to the organic electroluminescent element 12g. The step 13b may follow the edge of the film-thickness adjustment layer 28G. FIG. 6 illustrates ΔH5 as a height of this step 13b. In addition, on the upper part of the line bank 13 provided between the organic electroluminescent element 12r and the organic electroluminescent element 12g, for example, a step 13c may be disposed at a position closer to the organic electroluminescent element 12g. The step 13c may follow the edge of the film-thickness adjustment layer 28G. FIG. 6 illustrates ΔH6 as a height of this step 13c.

The height ΔH4 of the step 13a may be smaller than the thickness D1 of the film-thickness adjustment layer 28B. The height ΔH5 of the step 13b may be smaller than the thickness D2 of the film-thickness adjustment layer 28G. The height ΔH6 of the step 13c may be smaller than the thickness D2 of the film-thickness adjustment layer 28G. For example, the film-thickness adjustment layer 28B may be of a thickness that does not cause the upper part of the line bank 13 to be raised by the thicknesses D1 and D2 of the film-thickness adjustment layers 28G and 28B upon the formation of the line bank 13 in the manufacturing process. Furthermore, the similar may also hold true for the anode 21. For example, the anode 21 may be of a thickness that does not cause the upper part of the line bank 13 to be raised by the thickness of the anode 21 upon the formation of the line bank 13 in the manufacturing process. In a case where the heights ΔH4, ΔH5, and ΔH6 of the steps 13a, 13b, and 13c disposed on the upper parts of the line banks 13 meet the requirements described above, it is possible to prevent the pinning position on the line bank 13 from shifting upward by the thicknesses D1 and D2 of the film-thickness adjustment layers 28G and 28B. Note that, if the pinning position at the line bank 13 is shifted upward by the thicknesses D1 and D2 of the film-thickness adjustment layers 28G and 28B, the difference ΔH (ΔH1 and ΔH2) may be almost the same as a case where no film-thickness adjustment layer 28 is provided.

[Manufacturing Method]

Figure 9A:
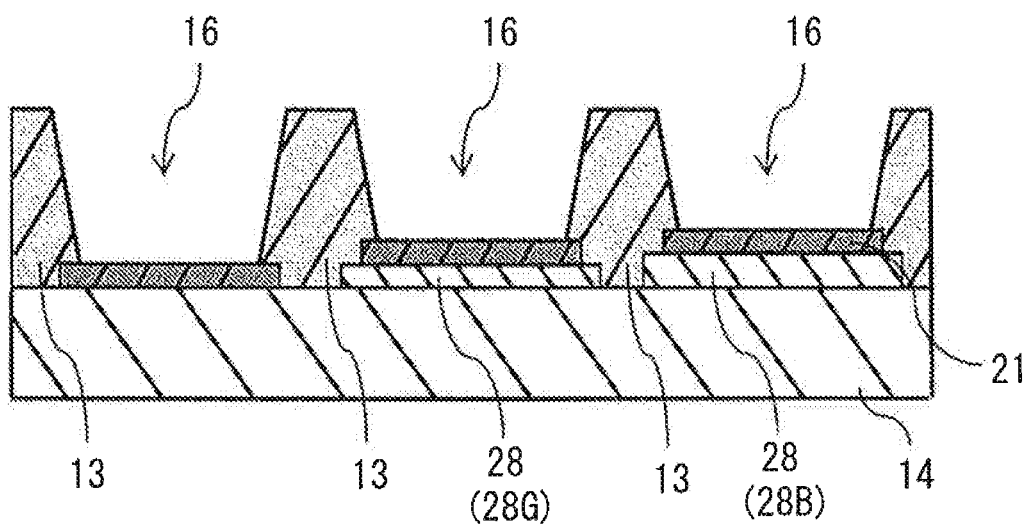
FIG. 9A is a view illustrating an example of a manufacturing process of the organic electroluminescent panel of FIG. 4.
Figure 9B:
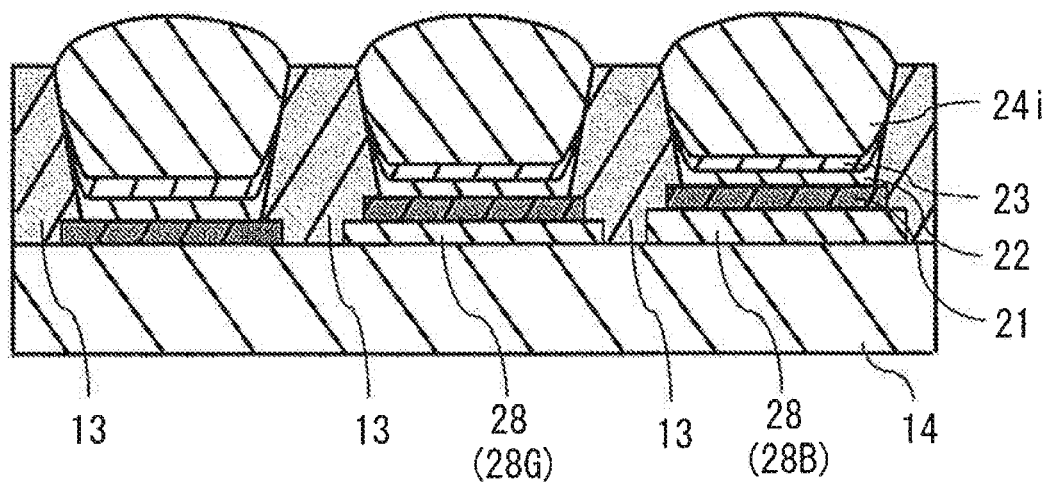
FIG. 9B is a view illustrating an example of a manufacturing process following FIG. 9A.
Figure 9C:
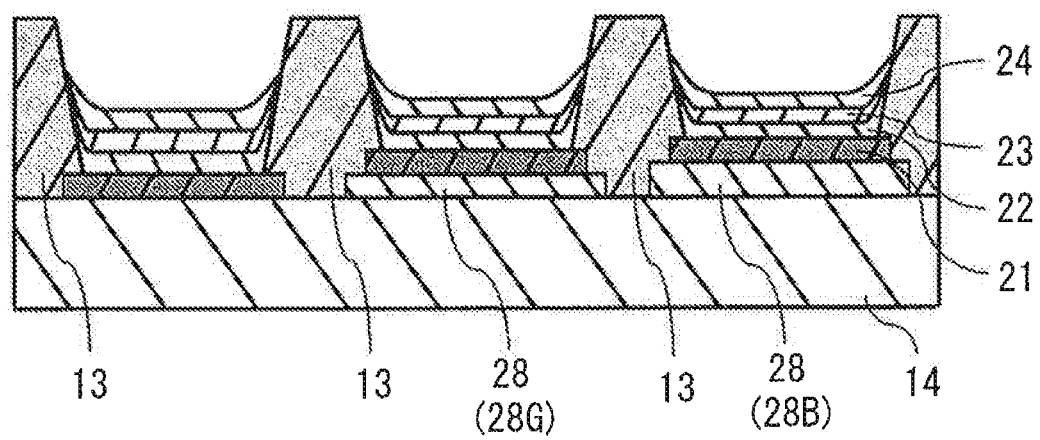
FIG. 9C is a view illustrating an example of a manufacturing process following FIG. 9B.

In the following, a method of manufacturing the organic electroluminescent panel 10 is described. FIG. 9A, FIG. 9B, and FIG. 9C illustrate an example of a manufacturing process of the organic electroluminescent panel 10.

First, film-thickness adjustment layers 28 may be formed on the predetermined subpixels 12 of the plurality of subpixels 12 on the substrate 14 (FIG. 9A). For example, on the substrate 14, the film-thickness adjustment layer 28G may be formed on the subpixel 12G and the film-thickness adjustment layer 28B may be formed on the subpixel 12B. The thickness D2 of the film-thickness adjustment layer 28G and the thickness D1 of the film-thickness adjustment layer 28B may be made different from each other. For example, the thickness D1 of the film-thickness adjustment layer 28B may be made thicker than the thickness D2 of the film-thickness adjustment layer 28G.

Thereafter, the anode 21 may be formed for each of the subpixels 12 (FIG. 9A). For example, the anode 21 may be formed on the film-thickness adjustment layer 28G as well as on the film-thickness adjustment layer 28B. Thereafter, the plurality of line banks 13 and the plurality of banks 15 may be so formed as to cover edges of the respective film-thickness adjustment layers 28 and the respective anodes 21. This may provide the grooves 16 extending in the row direction. The gap between the two line banks 13 may be set in accordance with a size of definition requested of the organic electroluminescent panel 10. The two line banks 13 may be parallel and adjacent to each other. The gap may be a width W1 of an opening of the groove 16.

In a process of forming the plurality of line banks 13 and the plurality of banks 15, the respective line banks 13 and the respective banks 15 may be further subjected to surface treatment. Methods of the surface treatment performed for each of the line banks 13 and each of the banks 15 may include, without limitation, wet processing or plasma processing. The wet processing uses a solution containing a predetermined alkaline solution or water, or an organic solvent, for example. The surface treatment to be performed on each of the line banks 13 and each of the line banks 15 with the method described above may, for example, adjust an angle of inclination of a side face of each of the line banks 13 and each of the banks 15, or provide liquid repellency for a part of a surface of each of the line banks 13 and each of the banks 15.

Thereafter, for example, an ink jet device may be used to discharge ink droplets, following which drying of the discharged ink may be performed to form the hole-injection layer 22 and the hole-transport layer 23 (FIG. 9B). Thereafter, the ink jet device may be used to discharge ink droplets to form an organic material layer 24i (FIG. 9B). The organic material layer 24i may be a liquid organic material layer having the organic light-emitting material 24M as a main component of a solute. For example, the organic material layer 24i may be first applied into the groove 16. Thereafter, drying may be performed on the organic material layer 24i to vaporize a solvent contained in the organic material layer 24i. This may result in the organic light-emitting layer 24 (FIG. 9C).

Thereafter, for example, the ink jet device may be used to discharge ink droplets, following which drying of the discharged ink may be performed to form the electron-transport layer 25 and the electron-injection layer 26. This may be followed by formation of the cathode 27 and the sealing layer 17 on the electron-injection layer 26 in this order. The organic electroluminescent panel 10 having the organic electroluminescent element 12-2 for each of the subpixels 12 may be thus manufactured in this manner.

[Effect]

In the following, some effects of the organic electroluminescent panel 10 and the organic electroluminescent unit 1 provided with the same are described.

There is known a method of manufacturing an organic electroluminescent panel by forming an organic electroluminescent element for each pixel with use of an ink jet device. A recent increase in definition has brought a reduction in pixel size and a reduction of a liquid amount to be retained per unit area. From the standpoint of solubility or a printable physical property such as viscosity, however, it is difficult to excessively increase an ink concentration. To address this, a method may be contemplated in which an amount of retained liquid is increased as much as possible by, for example, making side faces of partition walls that define the pixels lyophilic.

If the side faces of the banks are made lyophilic, however, a meniscus is formed on an ink surface in a process of drying ink. The meniscus is also formed on an upper surface of an ink layer after being dried. This makes a bank vicinity extremely thick in the ink layer, causing a phenomenon that a center part of a pixel emits light strongly. As a result, a part that is usable as a light-emitting part is reduced. Hence, it is desirable to provide an organic electroluminescent element, an organic electroluminescent panel, and a luminescent unit that make it possible to suppress a reduction in the part that is usable as the light-emitting part.

In contrast, in one embodiment, the film-thickness adjustment layer 28 is provided at the position that is outside of the resonator 20B and closer to the reflecting surface 21A. This film-thickness adjustment layer 28 has a thickness that is adjusted to allow the difference ΔH (ΔH1 and ΔH2) between the height H (H1 and H2) of the pinning position and the height T (T1 and T2) of the middle position of the upper surface of the laminate 20A to fall within a predetermined range. The pinning position is where the upper surface of the laminate 20A and the line banks 13 are in contact with each other. This makes it possible to make a depth of a meniscus to be formed on the laminate 20A shallower than a case in which no film-thickness adjustment layer 28 is provided. Thus, the percentage of the part that is unusable as the light-emitting part of the organic light-emitting layer 24 is reduced. Consequently, it is possible to suppress the reduction of the usable part as the light-emitting part of the organic light-emitting layer 24.

In addition, in one embodiment, the difference ΔH (ΔH1, ΔH2, and ΔH3) may be equal to or smaller than 500 nm. In this case, the flatness rate R of the laminate 20A may be equal to or larger than 50%. This reduces the percentage of the part that is unusable as the light-emitting part of the organic light-emitting layer 24. Consequently, it is possible to suppress the reduction of the usable part as the light-emitting part of the organic light-emitting layer 24.

In addition, in one embodiment, at least a part of the edge of the film-thickness adjustment layer 28 may be located immediately below each of the line banks 13. The steps 13a, 13b, and 13c may be disposed on upper parts of the respective line banks 13 and follow the edges of the film-thickness adjustment layer 28. The steps 13a, 13b, and 13c may have a thickness smaller than that of the film-thickness adjustment layer 28. This makes it possible to make the depth of the meniscus to be formed on the laminate 20A shallower than the case in which no film-thickness adjustment layer 28 is provided. Thus, the percentage of the part that is unusable as the light-emitting part of the organic light-emitting layer 24 is reduced. Consequently, it is possible to suppress the reduction of the usable part as the light-emitting part of the organic light-emitting layer 24.

In addition, in one embodiment, the organic electroluminescent elements 12r, 12g, and 12b may have the anode 21 having the reflecting surface 21A, and the film-thickness adjustment layer 28 may be an insulating layer in contact with the anode 21. This allows such an adjustment as to keep the differences ΔH (ΔH1 and ΔH2) within a predetermined range simply by adjusting the thickness of the film-thickness adjustment layer 28. Therefore, it is possible to suppress the reduction of the part that is usable as the light-emitting part of the organic light-emitting layer 24 in a simple manner.

MODIFICATION EXAMPLES

Modification examples of the organic electroluminescent unit 1 according to some embodiments described above are described below.

Modification Example A

Figure 10:
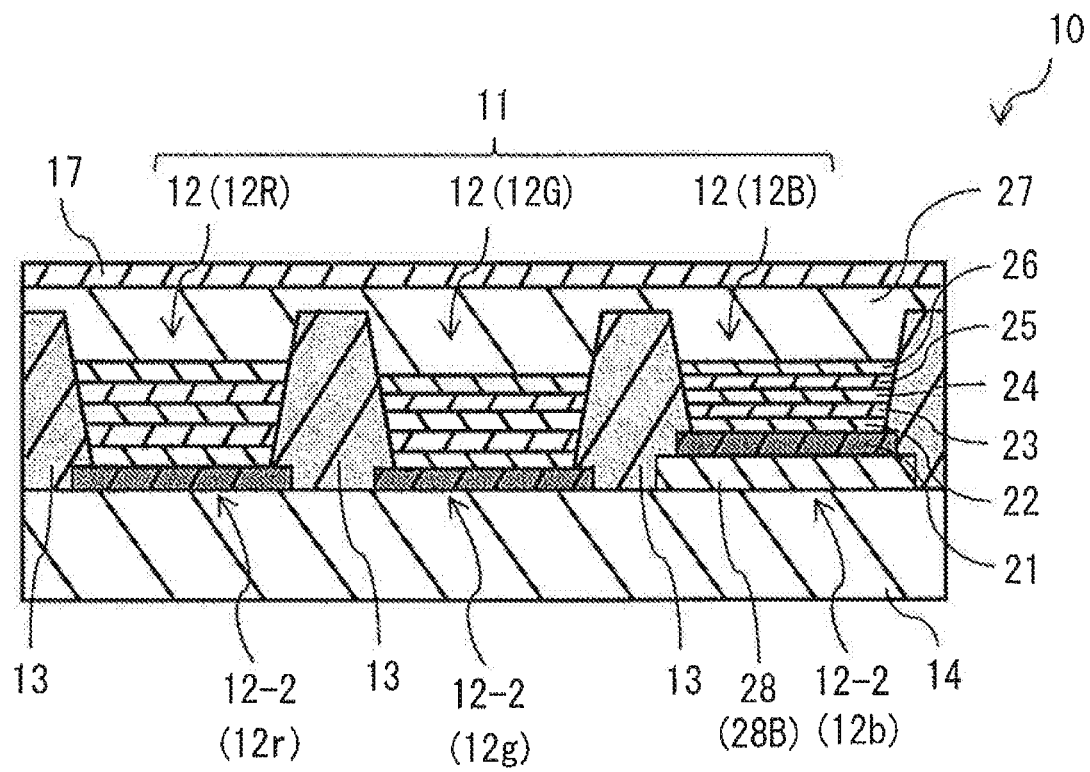
FIG. 10 is a view illustrating a modification example of the cross-sectional configuration of the organic electroluminescent panel of FIG. 4.
Figure 11:
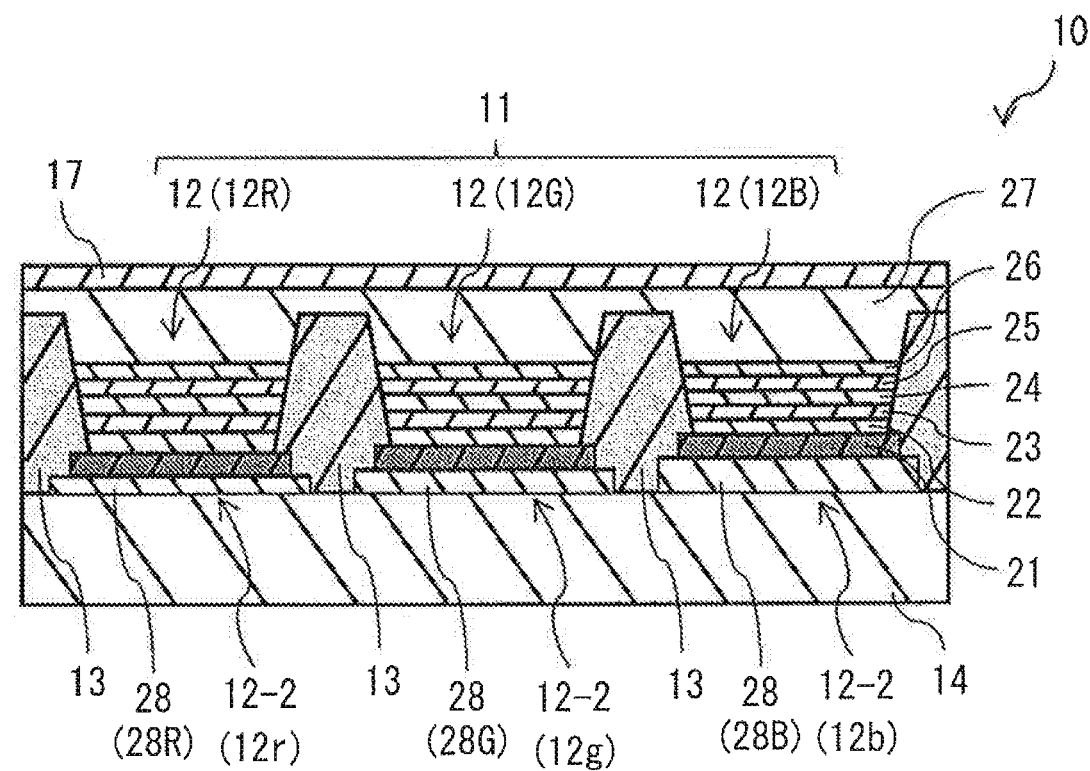
FIG. 11 is a view illustrating a modification example of the cross-sectional configuration of the organic electroluminescent panel of FIG. 4.

In some embodiments described above, the film-thickness adjustment layer 28 may be provided only for two of the organic electroluminescent elements 12-2 in one pixel 11. However, the film-thickness adjustment layer 28 may be provided for only one of the organic electroluminescent elements 12-2 in one pixel 11. Alternatively, the film-thickness adjustment layer 28 may be provided for all of the organic electroluminescent elements 12-2 in one pixel 11. As illustrated in FIG. 10, for example, the film-thickness adjustment layer 28 may be provided only for the organic electroluminescent element 12b. In addition, as illustrated in FIG. 11, for example, the film-thickness adjustment layer 28 may be provided for the organic electroluminescent elements 12r, 12g, and 12b. FIG. 10 and FIG. 11 illustrate one modification example of a cross-sectional configuration of the organic electroluminescent panel 10 of FIG. 4.

Modification Example B

Figure 12:
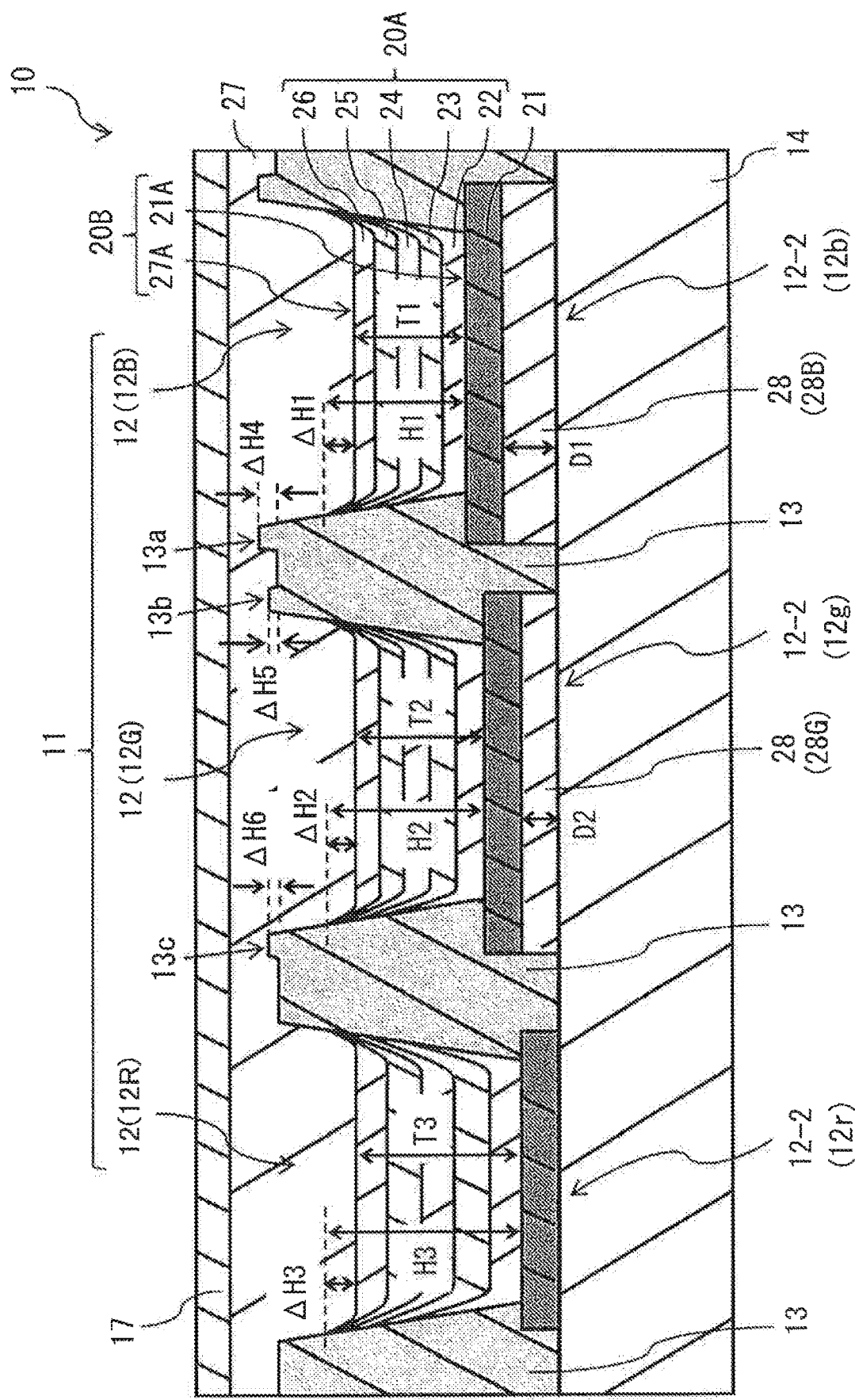
FIG. 12 is a view illustrating a modification example of a cross-sectional configuration of the organic electroluminescent panel of FIG. 6.

In addition, in some embodiments and the modification example thereof as described above, the edge of the anode 21 may be located more inside than the edge of the film-thickness adjustment layer 28. However, as illustrated in FIG. 12, for example, in some embodiments and the modification example thereof as described above, the anode 21 may be so provided that the anode 21 is in contact with a surface of the film-thickness adjustment layer 28 and the edge of the anode 21 is directly above the edge of the film-thickness adjustment layer 28.

In this case, at least a part of the respective edges of the film-thickness adjustment layer 28 and the anode 21 may be located immediately below each of the line banks 13. Furthermore, on an upper part of the line bank 13, the step 13a may be disposed at a position closer to the organic electroluminescent element 12b. The step 13a may follow the respective edges of the film-thickness adjustment layer 28B and the anode 21. This step 13a may have a height ΔH4 corresponding to a sum of thicknesses of the film-thickness adjustment layer 28B and the anode 21. In addition, on the upper part of the line bank 13 provided between the organic electroluminescent element 12b and the organic electroluminescent element 12g, the step 13b may be disposed at a position closer to the organic electroluminescent element 12g. The step 13b may follow the respective edges of the film-thickness adjustment layer 28G and the anode 21. This step 13b may have a height ΔH5 corresponding to the sum of the thicknesses of the film-thickness adjustment layer 28G and the anode 21. In addition, on the upper part of the line bank 13 provided between the organic electroluminescent element 12r and the organic electroluminescent element 12g, the step 13c may be disposed at a position closer to the organic electroluminescent element 12g. The step 13c may follow the respective edges of the film-thickness adjustment layer 28G and the anode 21. This step 13c may have a height ΔH6 corresponding to the sum of thicknesses of the film-thickness adjustment layer 28G and the anode 21.

In this modification example, the height ΔH4 of the step 13a may be smaller than the sum of the thickness D1 of the film-thickness adjustment layer 28B and the thickness of the anode 21. The height ΔH5 of the step 13b may be smaller than the sum of the thickness D2 of the film-thickness adjustment layer 28G and the thickness of the anode 21. The height ΔH6 of the step 13c may be smaller than the sum of the thickness D2 of the film-thickness adjustment layer 28G and the thickness of the anode 21. For example, the film-thickness adjustment layer 28B may be of thickness that does not cause the upper part of the line bank 13 to be raised by the sum of the thicknesses D1 and D2 of the film-thickness adjustment layers 28G and 28B and the thickness of the anode 21 upon the formation of the line bank in the manufacturing process. This prevents the pinning position on the line bank 13 from shifting upward by the sum of the thicknesses D1 and D2 of the film-thickness adjustment layers 28G and 28B and the thickness of the anode 21. Consequently, this allow the depth of the meniscus to be formed on the laminate 20A to be shallower than the case where no film-thickness adjustment layer 28 is provided. This reduces the percentage of the part that is unusable as the light-emitting part of the organic light-emitting layer 24. Therefore, it is possible to suppress the reduction of the part usable as the light-emitting part of the organic light-emitting layer 24.

Modification Example C

Figure 13:
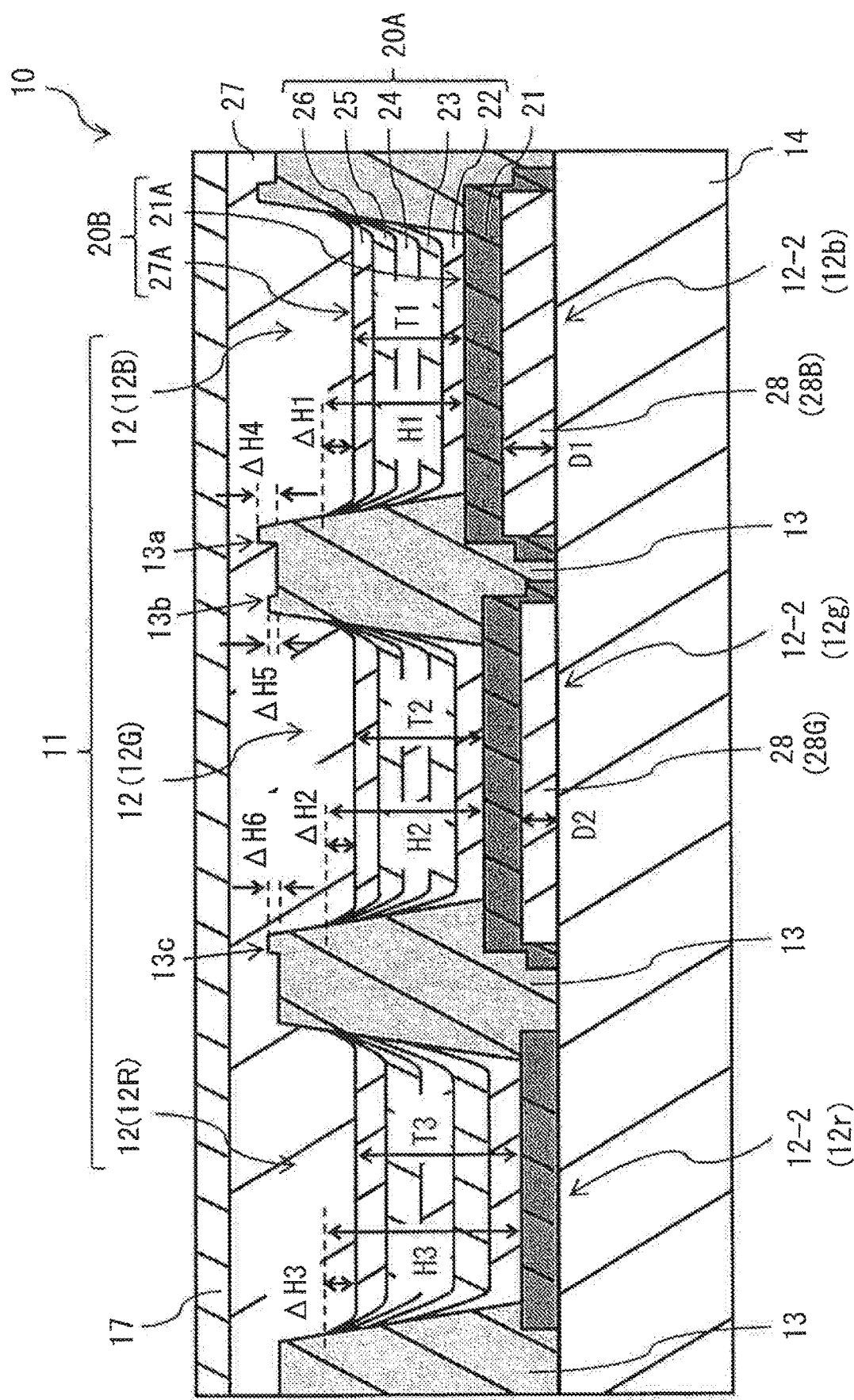
FIG. 13 is a view illustrating a modification example of the cross-sectional configuration of the organic electroluminescent panel of FIG. 6.

In some embodiments and the modification examples thereof as described above, the anode 21 may be provided in contact with a part of the surface of the film-thickness adjustment layer 28. However, as illustrated in FIG. 13, for example, in some embodiments and the modification examples thereof as described above, the anode 21 may be so provided as to cover an entire surface of the film-thickness adjustment layer 28.

In this case, on the upper part of the line bank 13 provided between the organic electroluminescent element 12b and the organic electroluminescent element 12g, the step 13a may be disposed at a position closer to the organic electroluminescent element 12b. The step 13a may follow the edge of the film-thickness adjustment layer 28B. FIG. 13 illustrates ΔH4 as a height of this step 13a. In addition, on the upper part of the line bank 13 provided between the organic electroluminescent element 12b and the organic electroluminescent element 12g, for example, the step 13b may be disposed at a position closer to the organic electroluminescent element 12g. The step 13b may follow the edge of the film-thickness adjustment layer 28G. FIG. 13 illustrates ΔH5 as a height of this step 13b. In addition, on the upper part of the line bank 13 provided between the organic electroluminescent element 12r and the organic electroluminescent element 12g, for example, the step 13c may be disposed at a position closer to the organic electroluminescent element 12g. The step 13c may follow the edge of the film-thickness adjustment layer 28G. FIG. 13 illustrates ΔH6 as a height of this step 13c.

In this modification example, the height ΔH4 of the step 13a may be smaller than the thickness D1 of the film-thickness adjustment layer 28B. Furthermore, in the anode 21, a height of a step disposed in the vicinity of the edge of the film-thickness adjustment layer 28B may be substantially equal to the thickness D1 of the film-thickness adjustment layer 28B. The height ΔH5 of the step 13b may be smaller than the thickness D2 of the film-thickness adjustment layer 28G. The height ΔH6 of the step 13c may be smaller than the thickness D2 of the film-thickness adjustment layer 28G. Furthermore, in the anode 21, a height of a step disposed in the vicinity of the edge of the film-thickness adjustment layer 28G may be substantially equal to the thickness D2 of the film-thickness adjustment layer 28G. In this modification example, the film-thickness adjustment layer 28B may be of thickness that does not cause the upper part of the line bank 13 to be raised by the thicknesses D1 and D2 of the film-thickness adjustment layers 28G and 28B upon the formation of the line bank 13 in the manufacturing process. Furthermore, the similar may also hold true for the anode 21. For example, the anode 21 may be of a thickness that does not cause the upper part of the line bank 13 to be raised by the thickness of the anode 21 upon the formation of the line bank 13 in the manufacturing process. In a case where the heights ΔH4, ΔH5, and ΔH6 of the steps 13a, 13b, and 13c disposed on the upper parts of the line banks 13 meet the requirements described above, it is possible to prevent the pinning position on the line bank 13 from shifting upward by the thicknesses D1 and D2 of the film-thickness adjustment layers 28G and 28B. Consequently, this allows the depth of the meniscus to be formed on the laminate 20A to be shallower than the case where no film-thickness adjustment layer 28 is provided. This reduces the percentage of the part that is unusable as the light-emitting part of the organic light-emitting layer 24. Therefore, it is possible to suppress the reduction of the part usable as the light-emitting part of the organic light-emitting layer 24.

Modification Example D

Figure 14:
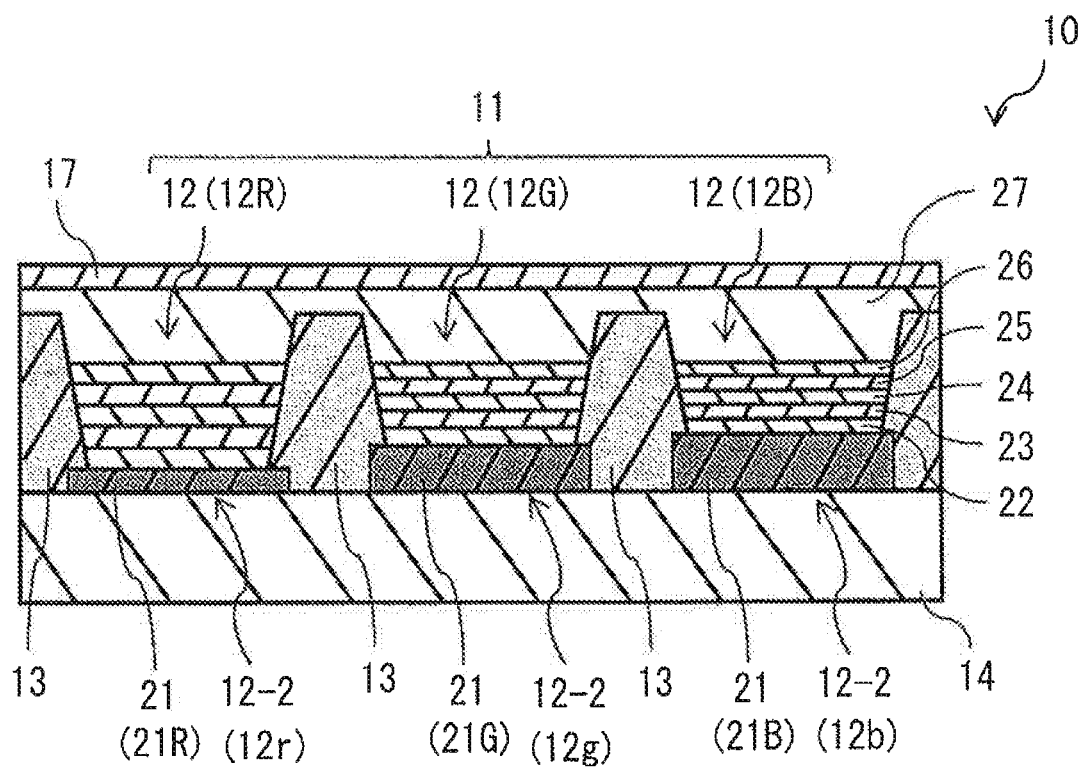
FIG. 14 is a view illustrating a modification example of the cross-sectional configuration of the organic electroluminescent panel of FIG. 4.
Figure 15:
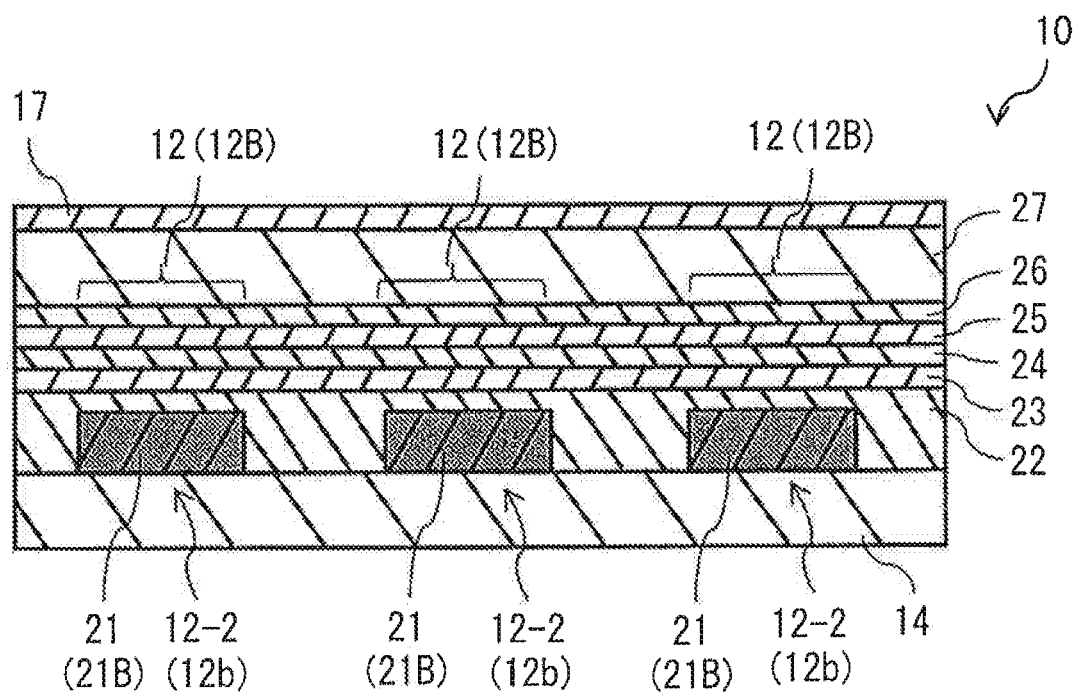
FIG. 15 is a view illustrating a modification example of a cross-sectional configuration of the organic electroluminescent panel of FIG. 5.
Figure 16:
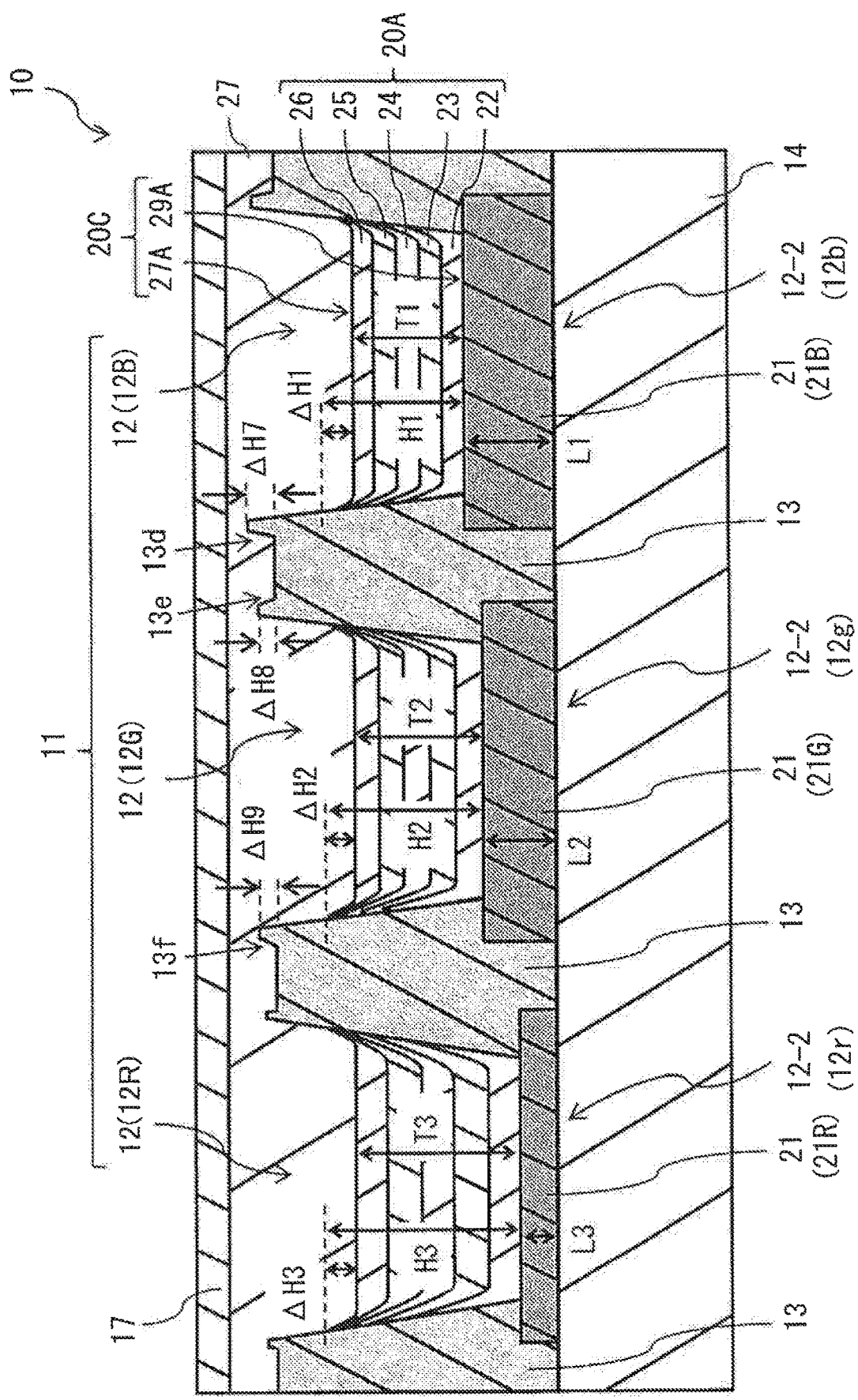
FIG. 16 is a view illustrating a modification example of the cross-sectional configuration of the organic electroluminescent panel of FIG. 6.

In addition, in some embodiments and the modification examples thereof as described above, the film-thickness adjustment layer 28 may be provided to make an adjustment so as to keep the differences ΔH (ΔH1 and ΔH2) within a predetermined range. In some embodiments and the modification examples thereof as described above, however, the film-thickness adjustment layer 28 may be omitted and the anode 21 may also serve as the film-thickness adjustment layer 28. As illustrated in FIG. 14, FIG. 15, and FIG. 16, for example, an anode 21B may serve as the film-thickness adjustment layer 28B in the organic electroluminescent element 12b, and the anode 21G may serve as the film-thickness adjustment layer 28G in the organic electroluminescent element 12g. Furthermore, the anode 21G may also serve as the film-thickness adjustment layer 28G in the organic electroluminescent element 12r.

In this modification example, the anode 21 may be disposed on the substrate 14. The edges of the anode 21 may be embedded in the line banks 13. In such an example, the line bank 13 may have a step on the upper part. The step may follow the edge of the anode 21. For example, on the upper part of the line bank 13 provided between the organic electroluminescent element 12b and the organic electroluminescent element 12g, a step 13d may be disposed at a position closer to the organic electroluminescent element 12b. The step 13d may follow the edge of the anode 21B. FIG. 16 illustrates ΔH7 as a height of this step 13d. In addition, on the upper part of the line bank 13 provided between the organic electroluminescent element 12b and the organic electroluminescent element 12g, for example, a step 13e may be disposed at a position closer to the organic electroluminescent element 12g. The step 13e may follow the edge of the anode 21G. FIG. 16 illustrates ΔH8 as a height of this step 13e. In addition, on the upper part of the line bank 13 provided between the organic electroluminescent element 12r and the organic electroluminescent element 12g, for example, a step 13f may be disposed at a position closer to the organic electroluminescent element 12g. The step 13f may follow the edge of the anode 21G. FIG. 16 illustrates ΔH9 as a height of this step 13f.

The height ΔH7 of the step 13d may be smaller than a thickness L1 of the anode 21B. The height ΔH8 of the step 13e may be smaller than a thickness L2 of the anode 21G. The height ΔH9 of the step 13f may be smaller than the thickness L2 of the anode 21G. For example, the anodes 21B and 21G may have a thickness that does not cause the upper part of the line bank 13 to be raised by the thicknesses L1 and L2 of the anodes 21B and 21G upon the formation of the line bank 13 in the manufacturing process. In a case where the heights ΔH7, ΔH8, and ΔH9 of the steps 13d, 13e, and 13f disposed on the upper parts of the line banks 13 meet the requirements described above, it is possible to prevent the pinning position on the line bank 13 from shifting upward by the thicknesses L1 and L2 of the film-thickness adjustment layers 28G and 28B. Note that, if the pinning position at the line bank 13 is shifted upward by the thicknesses L1 and L2 of the anodes 21B and 21G, the difference ΔH (ΔH1 and ΔH2) may be almost the same as a case where no film-thickness adjustment layer 28 is provided.

Thus, in this modification example, it is possible to make an adjustment so as to keep the difference ΔH (ΔH1, ΔH2, and ΔH3) within the predetermined range simply by adjusting the thickness of the anode 21. Therefore, it is possible to suppress the reduction of the part usable as the light-emitting part of the organic light-emitting layer 24 in a simple manner.

Modification Example E

Figure 17:
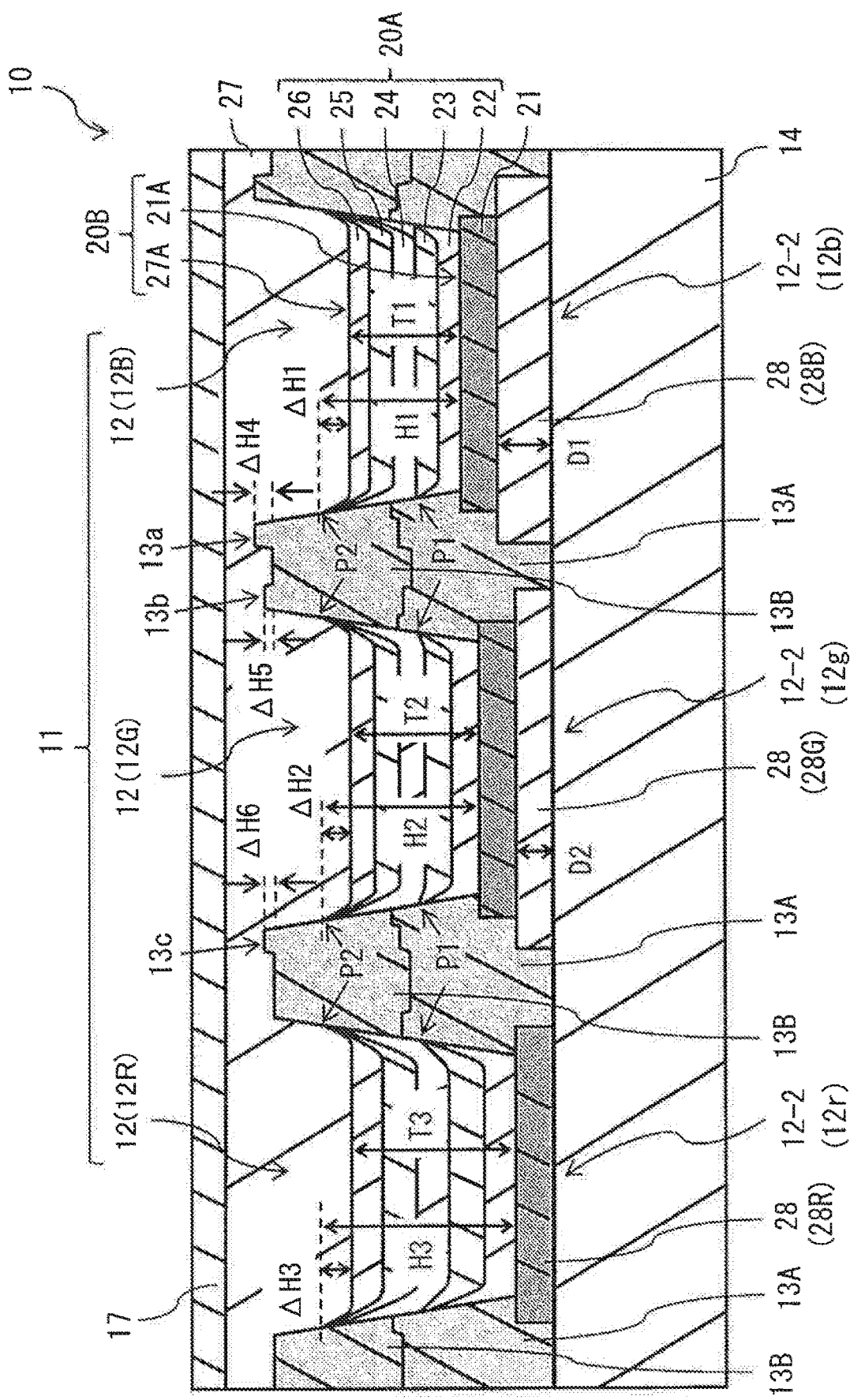
FIG. 17 is a view illustrating a modification example of the cross-sectional configuration of the organic electroluminescent panel of FIG. 6.
Figure 18:
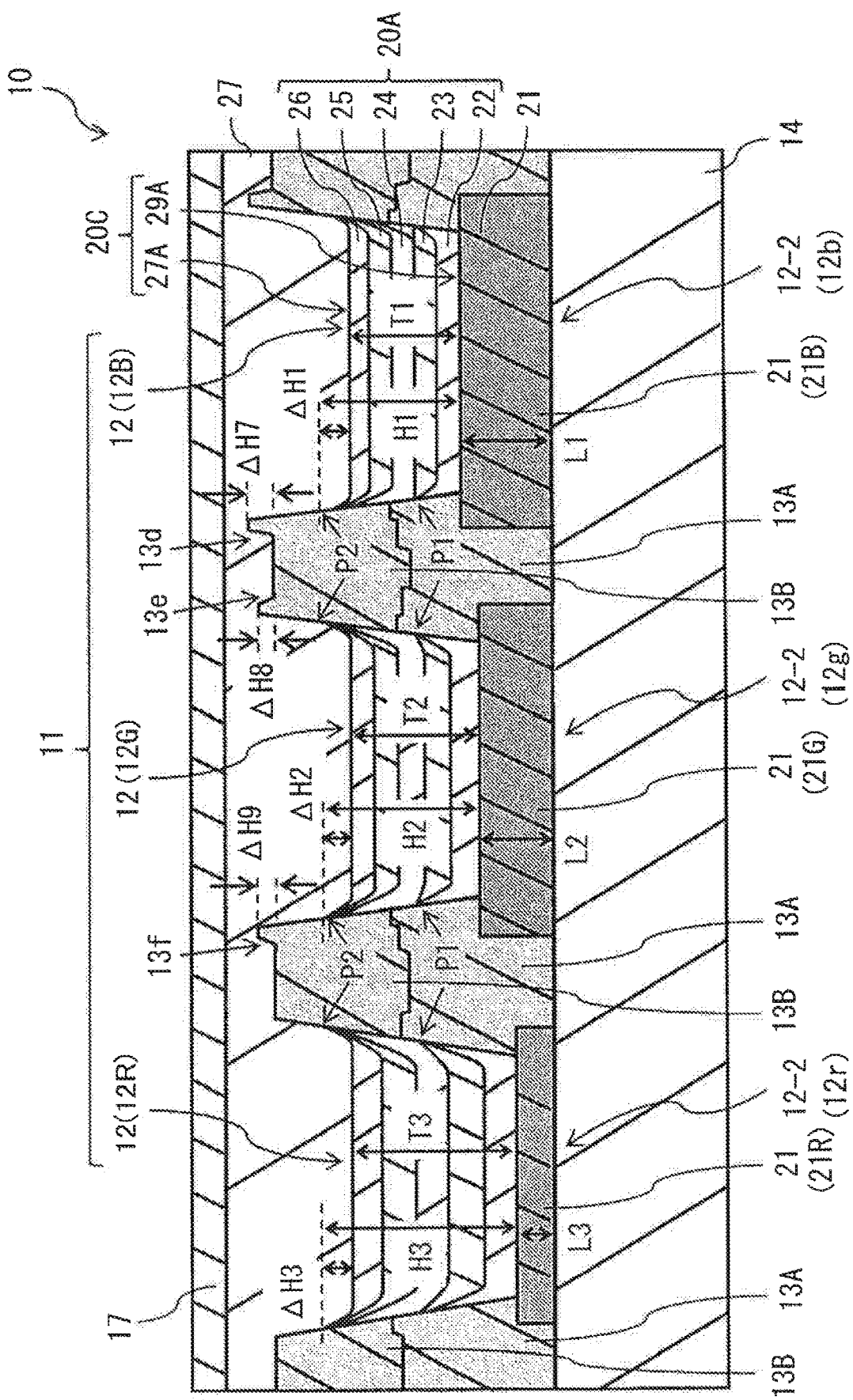
FIG. 18 is a view illustrating a modification example of a cross-sectional configuration of the organic electroluminescent panel of FIG. 16.

In some embodiments and the modification examples thereof as described above, the line bank 13 may have one pinning position disposed on corresponding one of both side faces. However, the pinning position to be disposed on the corresponding one of both side faces of the line bank 13 may be more than one. As illustrated in FIG. 17 and FIG. 18, for example, the pinning positions to be disposed on one of the side faces of the line bank 13 may be two locations. FIG. 17 illustrates one modification example of a cross-sectional configuration of the organic electroluminescent panel 10 of FIG. 6. FIG. 18 illustrates one modification example of a cross-sectional configuration of the organic electroluminescent panel 10 of FIG. 16.

In FIG. 17 and FIG. 18, the line bank 13 may have a configuration in which a line bank 13B is stacked on a line bank 13A. The line bank 13A may correspond to a specific example of a "first partition wall" in one embodiment of the disclosure. The line bank 13B may correspond to a specific example of a "second partition wall" in one embodiment of the disclosure. One pinning position may be provided for corresponding one of both side faces of the line bank 13A, and one pinning position may be provided for corresponding one of both side faces of the line bank 13B. The line bank 13A may have a pinning position P1 where an upper surface of the hole-injection layer 22 and an upper surface of the hole-transport layer 23 and the line bank 13A are in contact with each other. The hole-injection layer 22 and the hole-transport layer 23 may be closer to the reflecting surfaces 21A and 29A than the organic light-emitting layer 24. In contrast, the line bank 13B may have a pinning position P2 where the upper surface of the organic light-emitting layer 24, an upper surface of the electron-transport layer 25 and an upper surface of the electron-injection layer 26, and the line bank 13B are in contact with each other. The electron-transport layer 25 and the electron-injection layer 26 may be closer to the reflecting surface 27A than the organic light-emitting layer 24. The pinning position P1 may correspond to a boundary position between a lyophilic region and a liquid-repellent region on the side face of the line bank 13A, for example. In addition, the pinning position P2 may correspond to a boundary position between a lyophilic region and a liquid-repellent region on the side face of the line bank 13B, for example. In this modification example, the hole-injection layer 22 and the hole-transport layer 23 may correspond to a specific example of a "first organic material layer" in one embodiment of the disclosure. In this modification example, the electron-transport layer 25 and the electron-injection layer 26 may correspond to a specific example of a "second organic material layer" in one embodiment of the disclosure.

As such, the plurality of pinning positions are disposed for the corresponding one of both side faces of the line bank 13. Thus, the depth of the meniscus of each layer contained in the laminate 20A is made shallower than a case in which one pinning position is disposed for the corresponding one of both side faces of the line bank 13A. This reduces the percentage of the part that is unusable as the light-emitting part of the organic light-emitting layer 24. Consequently, it is possible to suppress the reduction of the part that is usable as the light-emitting part of the organic light-emitting layer 24.

Although the disclosure has been described by referring to some embodiments, it is not limited thereto but various modifications are possible. For example, in some embodiments described above, the plurality of line banks 13 and the plurality of banks 15 are provided on the substrate 14. Alternatively, one pixel bank may be provided for each of the subpixels 12.

It should be noted that the effects described herein are merely exemplary. The effects of the disclosure are not limited to those described herein. The disclosure may have other effects than those described herein.

It is possible to achieve the following configurations from the disclosure.

(1) An organic electroluminescent element including:
an organic electroluminescent part; and
a pair of partition walls provided on both sides of the organic electroluminescent part,
the organic electroluminescent part including
an organic material layer including a light-emitting layer that emits electroluminescence light,
a resonator that is in contact with the organic material layer, and includes an anode-side reflecting surface and a cathode-side reflecting surface that face each other with the organic material layer provided therebetween, and
a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range, the pinning position being a position at which the upper surface of the organic material layer and each of the partition walls are in contact with each other.

(2) The organic electroluminescent element according to (1), in which the difference is equal to or smaller than 500 nm.

(3) The organic electroluminescent element according to (1) or (2), in which
at least a part of an edge of the film-thickness adjustment layer is located below each of the partition walls,
the partition walls each have a step that follows the edge of the film-thickness adjustment layer, and
the step is smaller than the thickness of the film-thickness adjustment layer.

(4) The organic electroluminescent element according to (1) or (2), in which
the organic electroluminescent part includes an anode electrode having the anode-side reflecting surface,
the anode electrode is in contact with a surface of the film-thickness adjustment layer and provided to allow an edge of the anode electrode to be located above an edge of the film-thickness adjustment layer, at least a part of the edge of the film-thickness adjustment layer and at least a part of the edge of the anode electrode are located below each of the partition walls, the partition walls each have a step that follows the edge of the film-thickness adjustment layer and the edge of the anode electrode, and the step is smaller than a sum of the thickness of the film-thickness adjustment layer and a thickness of the anode electrode.

(5) The organic electroluminescent element according to any one of (1) to (3), in which the organic electroluminescent part includes an anode electrode having the anode-side reflecting surface, and the anode electrode serves as the film-thickness adjustment layer.

(6) The organic electroluminescent element according to any one of (1), (2), and (4), in which the organic electroluminescent part includes an anode electrode having the anode-side reflecting surface, and the film-thickness adjustment layer includes an insulating layer that is in contact with the anode electrode.

(7) The organic electroluminescent element according to any one of (1) to (6), in which the partition walls each include a first partition wall and a second partition wall stacked on the first partition wall, the organic material layer includes, in addition to the light-emitting layer, one or more first organic material layers provided closer to the anode-side reflecting surface and one or more second organic material layers closer provided to the cathode-side reflecting surface, the first partition wall has a pinning position at which an upper surface of the first organic material layer and the first partition wall are in contact with each other, and the second partition wall has a pinning position at which an upper surface of the second organic material layer and the second partition wall are in contact with each other.

(8) An organic electroluminescent panel including a plurality of pixels each including a plurality of subpixels, in each of the pixels, at least one of the subpixels including an organic electroluminescent part, and a pair of partition walls provided on both sides of the organic electroluminescent part, the organic electroluminescent part including an organic material layer including a light-emitting layer that emits electroluminescence light, a resonator that is in contact with the organic material layer, and includes an anode-side reflecting surface and a cathode-side reflecting surface that face each other with the organic material layer provided therebetween, and a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range, the pinning position being a position at which the upper surface of the organic material layer and each of the partition walls are in contact with each other.

(9) The organic electroluminescent panel according to (8), in which, in each of the pixels, at least two of the subpixels each include the organic electroluminescent part and the pair of partition walls, and in which, in each of the pixels, the thickness of the film-thickness adjustment layer of a first subpixel in the subpixels and the thickness of the film-thickness adjustment layer of a second subpixel, different from the first subpixel, in the subpixels satisfy the following relational expression:

$t1 < t2$ where $t1$ is the thickness of the film-thickness adjustment layer of the first subpixel, and $t2$ is the thickness of the film-thickness adjustment layer of the second subpixel.

(10) The organic electroluminescent panel according to (9), in which, in each of the pixels, a thickness of the organic material layer of the first subpixel and a thickness of the organic material layer of the second subpixel satisfy the following relational expression:

$t3 > t4$ where $t3$ is the thickness of the organic material layer of the first subpixel, and $t4$ is the thickness of the organic material layer of the second subpixel.

(11) The organic electroluminescent panel according to any one of (8) to (10), in which, in each of the pixels, the difference of the first subpixel and the difference of the second subpixel are each equal or smaller than 500 nm.

(12) A luminescent unit including:

an organic electroluminescent panel including a plurality of pixels; and a driver that drives the plurality of pixels, the plurality of pixels each including a plurality of subpixels, in each of the pixels, at least one of the subpixels including an organic electroluminescent part, and a pair of partition walls provided on both sides of the organic electroluminescent part, the organic electroluminescent part including an organic material layer including a light-emitting layer that emits electroluminescence light, a resonator that is in contact with the organic material layer, and includes an anode-side reflecting surface and a cathode-side reflecting surface that face each other with the organic material layer provided therebetween, and a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range, the pinning position being a position at which the upper surface of the organic material layer and each of the partition walls are in contact with each other.

In the organic electroluminescent element, the organic electroluminescent panel, and the luminescent unit according to respective example embodiments of the disclosure, the film-thickness adjustment layer is provided at the position that is outside of the resonator and closer to the anode reflecting surface. The film-thickness adjustment layer has the thickness that is adjusted to allow the difference between the height of the pinning position and the height of the middle position of the upper surface of the organic material layer to fall within a predetermined range. The pinning position is a position at which the upper surface of the organic material layer and each of the partition walls are in contact with each other. This makes it possible to make a depth of a meniscus to be formed on the organic material layer shallower than a case in which no film-thickness adjustment layer is provided. Thus, a percentage of a part that is unusable as a light-emitting part of a light-emitting layer is reduced.

The organic electroluminescent element, the organic electroluminescent panel, and the luminescent unit according to the respective example embodiments of the disclosure make it possible to make the depth of the meniscus to be formed on the organic material layer shallower than an existing organic electroluminescent panel. Since this reduces the percentage of the part that is unusable as the light-emitting part in the light-emitting layer, it is possible to suppress the reduction of the part that is usable as the light-emitting part of the light-emitting layer.

It should be noted that the effect of the disclosure is not limited to what is described here but may include any effect described herein.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent element comprising:
   an organic electroluminescent part; and
   a pair of partition walls provided on both sides of the organic electroluminescent part,
   the organic electroluminescent part including
      an organic material layer including a light-emitting layer that emits electroluminescence light,
      a resonator that is in contact with the organic material layer, and includes an anode-side reflecting surface and a cathode-side reflecting surface that face each other with the organic material layer provided therebetween, and
      a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range, the pinning position being a position at which the upper surface of the organic material layer and each of the partition walls are in contact with each other.

2. The organic electroluminescent element according to claim 1, wherein the difference is equal to or smaller than 500 nm.

3. The organic electroluminescent element according to claim 1, wherein
   at least a part of an edge of the film-thickness adjustment layer is located below each of the partition walls,
   the partition walls each have a step that follows the edge of the film-thickness adjustment layer, and
   the step is smaller than the thickness of the film-thickness adjustment layer.

4. The organic electroluminescent element according to claim 1, wherein
   the organic electroluminescent part includes an anode electrode having the anode-side reflecting surface,
   the anode electrode is in contact with a surface of the film-thickness adjustment layer and provided to allow an edge of the anode electrode to be located above an edge of the film-thickness adjustment layer,
   at least a part of the edge of the film-thickness adjustment layer and at least a part of the edge of the anode electrode are located below each of the partition walls,
   the partition walls each have a step that follows the edge of the film-thickness adjustment layer and the edge of the anode electrode, and
   the step is smaller than a sum of the thickness of the film-thickness adjustment layer and a thickness of the anode electrode.

5. The organic electroluminescent element according to claim 1, wherein
   the organic electroluminescent part includes an anode electrode having the anode-side reflecting surface, and
   the anode electrode serves as the film-thickness adjustment layer.

6. The organic electroluminescent element according to claim 1, wherein
   the organic electroluminescent part includes an anode electrode having the anode-side reflecting surface, and
   the film-thickness adjustment layer comprises an insulating layer that is in contact with the anode electrode.

7. The organic electroluminescent element according to claim 1, wherein
   the partition walls each include a first partition wall and a second partition wall stacked on the first partition wall,
   the organic material layer includes, in addition to the light-emitting layer, one or more first organic material layers provided closer to the anode-side reflecting surface and one or more second organic material layers closer provided to the cathode-side reflecting surface,
   the first partition wall has a pinning position at which an upper surface of the first organic material layer and the first partition wall are in contact with each other, and
   the second partition wall has a pinning position at which an upper surface of the second organic material layer and the second partition wall are in contact with each other.

8. An organic electroluminescent panel comprising
   a plurality of pixels each including a plurality of subpixels,
   in each of the pixels, at least one of the subpixels including
   an organic electroluminescent part, and
   a pair of partition walls provided on both sides of the organic electroluminescent part,
   the organic electroluminescent part including
      an organic material layer including a light-emitting layer that emits electroluminescence light,
      a resonator that is in contact with the organic material layer, and includes an anode-side reflecting surface and a cathode-side reflecting surface that face each other with the organic material layer provided therebetween, and
      a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range, the pinning position being a position at which the upper surface of the organic material layer and each of the partition walls are in contact with each other.

9. The organic electroluminescent panel according to claim 8,
wherein, in each of the pixels, at least two of the subpixels each include the organic electroluminescent part and the pair of partition walls, and
wherein, in each of the pixels, the thickness of the film-thickness adjustment layer of a first subpixel in the subpixels and the thickness of the film-thickness adjustment layer of a second subpixel, different from the first subpixel, in the subpixels satisfy the following relational expression:

$$t1 < t2$$

where t1 is the thickness of the film-thickness adjustment layer of the first subpixel, and t2 is the thickness of the film-thickness adjustment layer of the second subpixel.

10. The organic electroluminescent panel according to claim 9, wherein, in each of the pixels, a thickness of the organic material layer of the first subpixel and a thickness of the organic material layer of the second subpixel satisfy the following relational expression:

$$t3 > t4$$

where t3 is the thickness of the organic material layer of the first subpixel, and t4 is the thickness of the organic material layer of the second subpixel.

11. The organic electroluminescent panel according to claim 8, wherein, in each of the pixels, the difference of the first subpixel and the difference of the second subpixel are each equal or smaller than 500 nm.

12. A luminescent unit comprising:
an organic electroluminescent panel including a plurality of pixels; and
a driver that drives the plurality of pixels,
the plurality of pixels each including a plurality of subpixels,
in each of the pixels, at least one of the subpixels including
an organic electroluminescent part, and
a pair of partition walls provided on both sides of the organic electroluminescent part,
the organic electroluminescent part including
an organic material layer including a light-emitting layer that emits electroluminescence light,
a resonator that is in contact with the organic material layer, and includes an anode-side reflecting surface and a cathode-side reflecting surface that face each other with the organic material layer provided therebetween, and
a film-thickness adjustment layer provided at a position that is outside of the resonator and closer to the anode-side reflecting surface, and having a thickness that is adjusted to allow a difference between a height of a pinning position and a height of a middle position of an upper surface of the organic material layer to fall within a predetermined range, the pinning position being a position at which the upper surface of the organic material layer and each of the partition walls are in contact with each other.

* * * * *